(12) United States Patent
Chang et al.

(10) Patent No.: US 11,961,551 B2
(45) Date of Patent: Apr. 16, 2024

(54) BITLINE SENSE AMPLIFIER AND A MEMORY DEVICE WITH AN EQUALIZER

(71) Applicant: SAMSUNG ELECTRONICS CO., LTD., Suwon-si (KR)

(72) Inventors: Soo Bong Chang, Incheon (KR); Young-Il Lim, Suwon-si (KR); Bok-Yeon Won, Namyangju-si (KR); Seok Jae Lee, Gwangmyeong-si (KR); Dong Geon Kim, Suwon-si (KR); Myeong Sik Ryu, Anyang-si (KR); In Seok Baek, Suwon-si (KR); Kyoung Min Kim, Namyangju-si (KR); Sang Wook Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 163 days.

(21) Appl. No.: 17/585,865

(22) Filed: Jan. 27, 2022

(65) Prior Publication Data

US 2022/0328093 A1    Oct. 13, 2022

(30) Foreign Application Priority Data

Apr. 9, 2021  (KR) .................. 10-2021-0046472
Jul. 1, 2021   (KR) .................. 10-2021-0086564

(51) Int. Cl.
*G11C 11/4091* (2006.01)
*G11C 11/4094* (2006.01)

(52) U.S. Cl.
CPC ...... *G11C 11/4091* (2013.01); *G11C 11/4094* (2013.01)

(58) Field of Classification Search
CPC .. G11C 11/4091; G11C 11/4094; G11C 7/065
See application file for complete search history.

(56) References Cited

U.S. PATENT DOCUMENTS

| 6,479,851 | B1 | 11/2002 | Lee |
| 7,102,935 | B2 | 9/2006 | Miki et al. |
| 7,102,954 | B2 | 9/2006 | Noda et al. |

(Continued)

FOREIGN PATENT DOCUMENTS

| JP | 4120013 | 2/1998 |
| JP | 2000124415 | 4/2000 |

(Continued)

*Primary Examiner* — Sultana Begum
(74) *Attorney, Agent, or Firm* — F. Chau & Associates, LLC

(57) ABSTRACT

A bitline sense amplifier including: an amplifier which is connected between a first sensing bitline and a second sensing bitline, and detects and amplifies a voltage difference between a first bitline and a second bitline in response to a first control signal and a second control signal; and an equalizer which is connected between a first supply line through which the first control signal is supplied and a second supply line through which the second control signal is supplied, and pre-charges the first bitline and the second bitline with a precharge voltage in response to an equalizing control signal, wherein the equalizer includes an equalizing enable transistor in which a source terminal is connected to the first supply line and performs equalizing in response to the equalizing control signal.

20 Claims, 15 Drawing Sheets

(56) References Cited

U.S. PATENT DOCUMENTS

| | | |
|---|---|---|
| 7,123,531 B2 | 10/2006 | Rho |
| 7,660,141 B2 | 2/2010 | Chang |
| 7,898,886 B2 | 3/2011 | Kwon et al. |
| 8,194,485 B2 | 6/2012 | Jung et al. |
| 8,514,602 B2 | 8/2013 | Noda |
| 8,872,277 B2 | 10/2014 | Chun |
| 9,773,544 B2 | 9/2017 | Woo et al. |
| 10,453,518 B1 | 10/2019 | Nagai |
| 10,490,259 B2 | 11/2019 | Jeong et al. |
| 2005/0052916 A1* | 3/2005 | Brox ................ G11C 11/40615 365/203 |
| 2020/0143869 A1 | 5/2020 | Seo et al. |
| 2020/0372948 A1 | 11/2020 | Kim et al. |

FOREIGN PATENT DOCUMENTS

| | | |
|---|---|---|
| KR | 0855843 | 9/2008 |
| KR | 20090034006 | 4/2009 |
| KR | 10-2011-0001784 | 1/2011 |
| KR | 04-16793 | 10/2020 |

\* cited by examiner

BITLINE SENSE AMPLIFIER AND A MEMORY DEVICE WITH AN EQUALIZER

This U.S. non-provisional application claims priority under 35 U.S.C. § 119 to Korean Patent Application No. 10-2021-0046472, filed on Apr. 9, 2021 and Korean Patent Application No. 10-2021-0086564, filed on Jul. 1, 2021 in the Korean Intellectual Property Office, the disclosures of which are incorporated by reference herein in their entireties.

1. TECHNICAL FIELD

The present inventive concept relates to a bitline sense amplifier of a memory device.

2. DESCRIPTION OF THE RELATED ART

A semiconductor memory device is used to store data. Random Access Memory (RAM) is a volatile memory device that loses data in the absence of power. A RAM is mainly used as a main memory device of a computer. A Dynamic Random Access Memory (DRAM) is a type of RAM that is volatile and made up of memory cells. For example, a DRAM uses a transistor and a capacitor per cell. To detect data stored in the memory cells of a DRAM, bitlines and complementary bitlines are pre-charged with a precharge voltage, a charge sharing operation is performed, and a difference between a voltage level of the bitline and a voltage level of complementary bitline results. A sense amplifier then receives and amplifies the voltage difference between the bitline and the complementary bitline to detect the data stored in the memory cell.

Due to recent developments in the electronic industry, there is an increasing demand for higher functionality, higher speed, and smaller sized electronic components. Accordingly, to increase the degree of integration of the semiconductor memory device, an area of a memory cell region and a peripheral circuit region have been reduced. In addition, efforts have been made to increase the amount of data processed to speed up the data processing time.

SUMMARY

Embodiments of the present inventive concept provide a semiconductor memory device in which the number of upper conductors of a sense amplifier is reduced to increase an efficiency of an area occupied by a peripheral circuit.

According to an embodiment of the present inventive concept, there is provided a bitline sense amplifier including: an amplifier which is connected between a first sensing bitline and a second sensing bitline, and detects and amplifies a voltage difference between a first bitline and a second bitline in response to a first control signal and a second control signal; and an equalizer which is connected between a first supply line through which the first control signal is supplied and a second supply line through which the second control signal is supplied, and pre-charges the first bitline and the second bitline with a precharge voltage in response to an equalizing control signal, wherein the equalizer includes an equalizing enable transistor in which a source terminal is connected to the first supply line and performs equalizing in response to the equalizing control signal.

According to an embodiment of the present inventive concept, there is provided a bitline sense amplifier including: an equalizing enable transistor which has a first end connected to a first supply line to precharge a first bitline and a second bitline with a precharge voltage in response to an equalizing control signal; a first supply transistor which provides the first supply voltage to the first supply line in response to a first control signal; and an amplifier which is connected between a first sensing bitline and a second sensing bitline, and detects and amplifies a voltage difference between the first bitline and the second bitline in response to the first control signal and a second control signal, wherein the equalizing enable transistor and the first supply transistor share a single active region.

According to an embodiment of the present inventive concept, there is provided a bitline sense amplifier including: an equalizer which is connected between a first supply line of a first control signal and a second supply line of a second control signal, equalizes the first and second control signals in response to a first equalizing control signal, and pre-charges a first bitline and a second bitline with a precharge voltage in response to a second equalizing control signal; an amplifier which is connected between a first sensing bitline and a second sensing bitline, and detects and amplifies a voltage difference between the first bitline and the first bitline in response to the first and second control signals; a first offset transistor which operates in response to an offset control signal connected between the first bitline and the second sensing bitline; and a second offset transistor which is connected between the second bitline and the first sensing bitline and operates in response to the offset control signal, wherein the equalizer includes an equalizing enable transistor which has one end connected to the first supply line or the second supply line, and performs precharging of the first and second bitlines in response to the second equalizing control signal, and the second equalizing control signal is enabled prior to the precharging on the basis of the offset control signal.

According to an embodiment of the present inventive concept, there is provided a bitline sense amplifier including: an equalizer which is connected between a first supply line of a first control signal and a second supply line of a second control signal, and pre-charges a first bitline and a second bitline with a precharge voltage in accordance with an equalizing control signal; and an amplifier which is connected between a first sensing bitline and a second sensing bitline, and detects and amplifies a voltage difference between the first bitline and the second bitline in accordance with the first and second control signals, wherein the equalizer includes an equalizing enable transistor having one end connected to the first supply line or the second supply line to perform precharging, and the equalizing enable transistor includes: a first active region which includes a first region placed in a pair to extend parallel in a first direction, and a second region connected to each of one end of the pair and having a rectangular shape; a first gate pattern which extends in a second direction on the first region and to which the equalizing control signal is applied; and a first gate pattern pair which extends parallel in the first direction on the second region and to which the first control signal or the second control signal is applied.

According to an embodiment of the present inventive concept, there is provided a bitline sense amplifier including: an equalizing enable transistor; and an amplifier which detects and amplifies a voltage difference between a first bitline and a second bitline in accordance with first and second control signals, wherein the equalizing enable transistor includes: a P-type shared active region that includes a first rectangular region, a second rectangular region, and a bridge region which connects the first and second rectangular regions, on a substrate; a first control signal contact which is placed on the first rectangular region and to which a first control signal is applied; a second control signal contact which is placed on the second rectangular region and to which a second control signal is applied; and a first gate pattern which is placed on the bridge region and to which an equalizing control signal is applied.

BRIEF DESCRIPTION OF THE DRAWINGS

The above and other features of the present inventive concept will become more apparent by describing in detail embodiments thereof referring to the attached drawings, in which.

DETAILED DESCRIPTION OF THE EMBODIMENTS

Hereinafter, embodiments of the present inventive concept will be described referring to the accompanying drawings.

Figure 1:
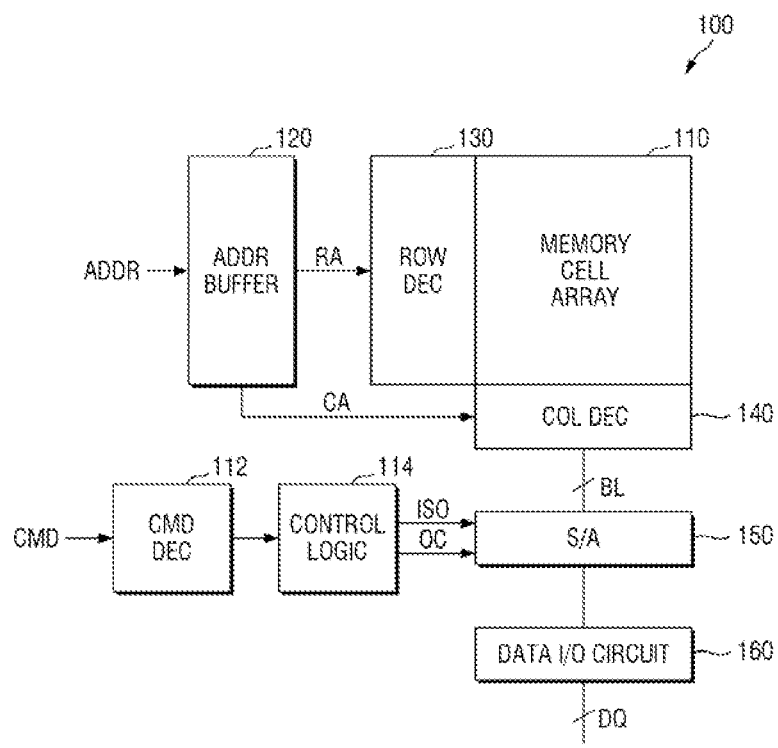
FIG. 1 is a diagram showing a memory device according to some embodiments of the present inventive concept.

FIG. 1 is a diagram showing a memory device according to some embodiments of the present inventive concept.

Referring to FIG. 1, a memory device 100 may be a storage device based on a semiconductor device. For example, the memory device 100 may be a Dynamic Random Access Memory (DRAM) such as a Double Data Rate Static DRAM (DDR SDRAM), a Single Data Rate SDRAM (SDR SDRAM), a Low Power DDR SDRAM (LPDDR SDRAM), a Low Power SDR SDRAM (LPSDR SDRAM), and a Rambus DRAM (Direct RDRAM) or an arbitrary volatile memory device. In particular, the memory device 100 may be a device to which standard protocols such as DDR4 or DDR5 are applied.

As an example, the number of data pins to which the DDR4 or DDR5 standard protocols are applied may be four, eight and sixteen, and the number of data pins of the semiconductor memory device 100 according to the present inventive concept may be sixteen. Hereinafter, although the description of the number of data pins of a memory system described herein may be applied according to the standard protocols for DRAM, the inventive concept is not necessarily limited thereto.

The memory device 100 may output data through data lines DQ in response to command CMD, address ADDR and control signals received from an external device, for example, a memory controller. The memory device 100 includes a memory cell array 110, a command decoder 112, a control logic 114, an address buffer 120, a row decoder 130, a column decoder 140, a sense amplifier array 150, and a data input/output circuit 160.

The memory cell array 110 includes a plurality of memory cells provided in the form of a matrix arranged in rows and columns. The memory cell array 110 includes a plurality of word lines and a plurality of bitlines BL connected to the memory cells. The plurality of word lines may be connected to rows of the memory cells, and the plurality of bitlines BL may be connected to columns of the memory cells.

The command decoder 112 decodes the commands received from the memory controller, for example, a write enable signal /WE, a row address strobe signal /RAS, a column address strobe signal /CAS, a chip selection signal /CS and the like. The command CMD may include an active command, a read command, a write command, a precharge command, and the like.

The control logic 114 may generate various control signals to perform an access operation on the memory cell array 110, for example, a write operation, a read operation, a pre-charge operation, and the like, in response to a decoded command.

The address buffer 120 receives the address ADDR from the memory controller which is an external device. The address ADDR includes a row address RA that addresses the row of the memory cell array 110, and a column address CA that addresses the column of the memory cell array 110. The address buffer 120 may transmit the row address RA to the row decoder 130, and may transmit the column address CA to the column decoder 140.

The row decoder 130 may select one of a plurality of word lines connected to the memory cell array 110. The row decoder 130 may decode the row address RA received from the address buffer 120, select any one word line corresponding to the row address RA, and activate the selected word line. A high power voltage (e.g., VPP) higher than a power voltage (e.g., VDD) may be applied to a gate of an access transistor of the memory cell at the time of activation of the word line, in other words, a word line enable operation.

The column decoder 140 may select a predetermined bitline among the plurality of bitlines BL of the memory cell array 110. The column decoder 140 may decode the column address CA received from the address buffer 120 and select a predetermined bitline BL corresponding to the column address CA.

The sense amplifier array (S/A) 150 is connected to the bitlines BL of the memory cell array 110. The sense amplifier array 150 detects a voltage change of a selected bitline among the plurality of bitlines BL, and amplifies and outputs the voltage change. The data input/output circuit 160 may output the data, which is output on the basis of the voltage detected and amplified from the sense amplifier array 150, to the outside through the data lines DQ. Any bitline sense amplifier BLSA may be connected to a bitline pair including a first bitline BL and a second bitline BLB to sense and amplify the potential generated on the bitlines. A specific connection between the bitline sense amplifier and the bitline pair will be described below in FIGS. 3 and 4.

The sense amplifier array 150 may receive an isolation signal ISO and an offset removal signal OC from the control logic 114. The sense amplifier array 150 may perform an offset removal operation according to the isolation signal ISO and the offset removal signal OC. As an example, the offset refers to a characteristic between the semiconductor elements that make up the sense amplifier array 150, for example a difference in threshold voltage.

Figure 2:
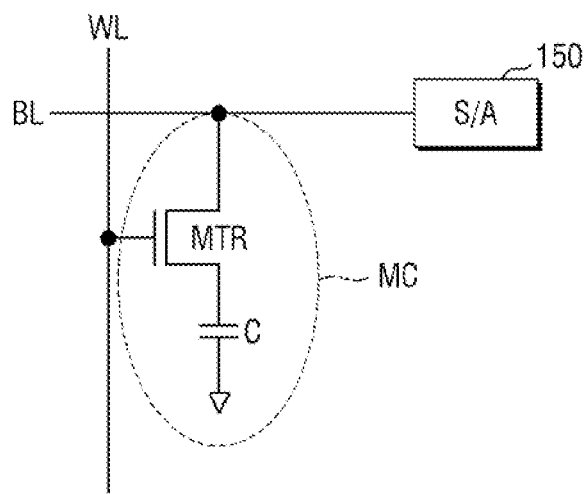
FIG. 2 is a diagram showing a memory cell of FIG. 1.

FIG. 2 is a diagram showing the memory cell of FIG. 1.

Referring to FIGS. 1 and 2, the memory cells MC included in the memory cell array are connected to each of the word lines WL and the bitlines BL.

The memory cell MC is made up of a cell transistor MTR and a cell capacitor C. The memory device 100 may perform a read operation or a refresh operation on the basis of the amount of an electric charge stored in the cell capacitor C. In this case, the first bitline BL connected to the memory cell MC is pre-charged with a precharge voltage Vpre. After that, as the word line WL connected to the memory cell MC is activated, the charge of the first bitline BL charged with the precharge voltage Vpre is shared the charge of the cell capacitor C of the memory cell MC. Due to the charge sharing operation, the voltage of the first bitline BL may decrease or increase by a voltage change amount V from the precharge voltage Vpre. Each of the sense amplifiers in the sense amplifier array 150 may detect and amplify the voltage change amount V.

Figure 3:
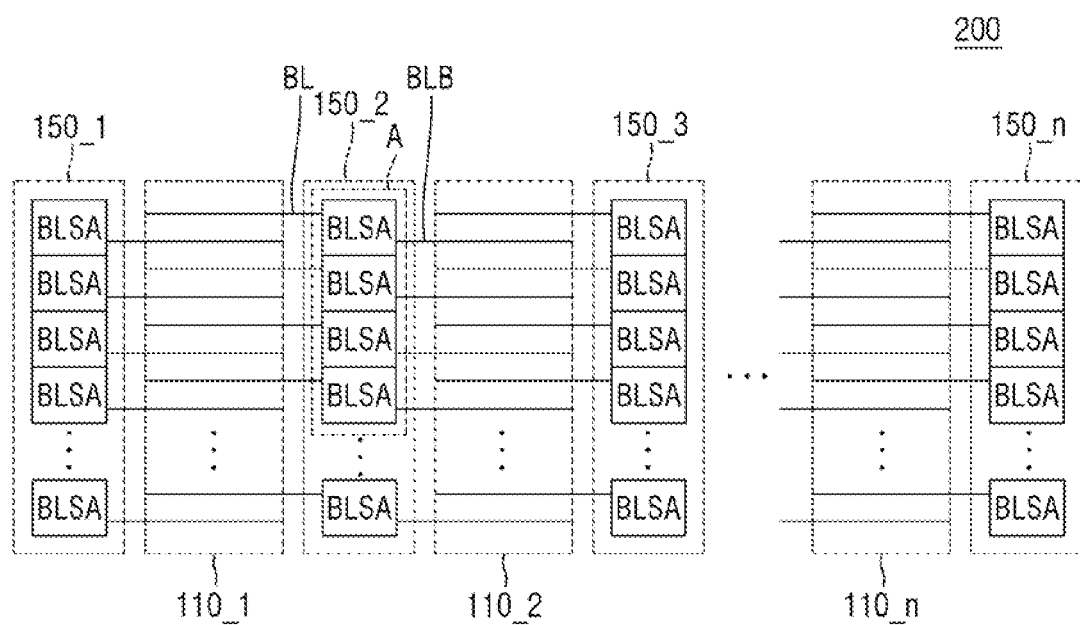
FIG. 3 is a diagram showing a memory cell array to which a sense amplifier according to some embodiments of the present inventive concept is applied.

FIG. 3 is a diagram showing a memory cell array to which a sense amplifier according to some embodiments of the present inventive concept is applied.

Referring to FIG. 3, the memory device 200 includes a plurality of memory cell arrays 110_1 to 110_n, and a plurality of sense amplifiers 150_1 to 150_n.

Each of the plurality of sense amplifiers 150_1 to 150_n may include a plurality of bitline sense amplifiers BLSA. The bitline sense amplifier BLSA may be implemented as the sense amplifier array 150 described in FIGS. 1 to 2.

A plurality of bitline pairs BL and BLB connected to the plurality of memory cell arrays 110_1 to 110_n may each be connected to the plurality of bitline sense amplifiers BLSA. Each of the bitline sense amplifiers BLSA may be a cross-coupled differential sense amplifier which is implemented by a P-type sense amplifier and an N-type sense amplifier.

Each of the bitline amplifiers BLSA is a circuit element that operates when the memory device 200 operates, and is distinguished from dummy sense amplifiers implemented in a region other than a region in which bitline sense amplifiers BLSA are implemented.

According to some embodiments of the present inventive concept, an odd bitline of the memory cell array 110_1 may be connected to a first bitline BL, and an even bitline may be connected to a second bitline BLB. The bitline sense amplifier 150-2 may be connected to each of the bitline pairs BL and BLB in both directions. In other words, a left terminal of the bitline sense amplifier 150-2 is connected to the even bitline of the memory cell array 110_1, in other words, the first bitline BL, and a right terminal of the bitline sense amplifier 150-2 is connected to the even bitline of the memory cell array 110_2, in other words, the second bitline BLB.

When the potential of the first bitline BL is a high potential in the sensing operation of the bitline sense amplifier BLSA, the potential of the second bitline BLB becomes a low potential. On the other hand, when the potential of the first bitline BL is the low potential in the sensing operation of the bitline sense amplifier BLSA, the potential of the second bitline BLB becomes the high potential.

Figure 4:
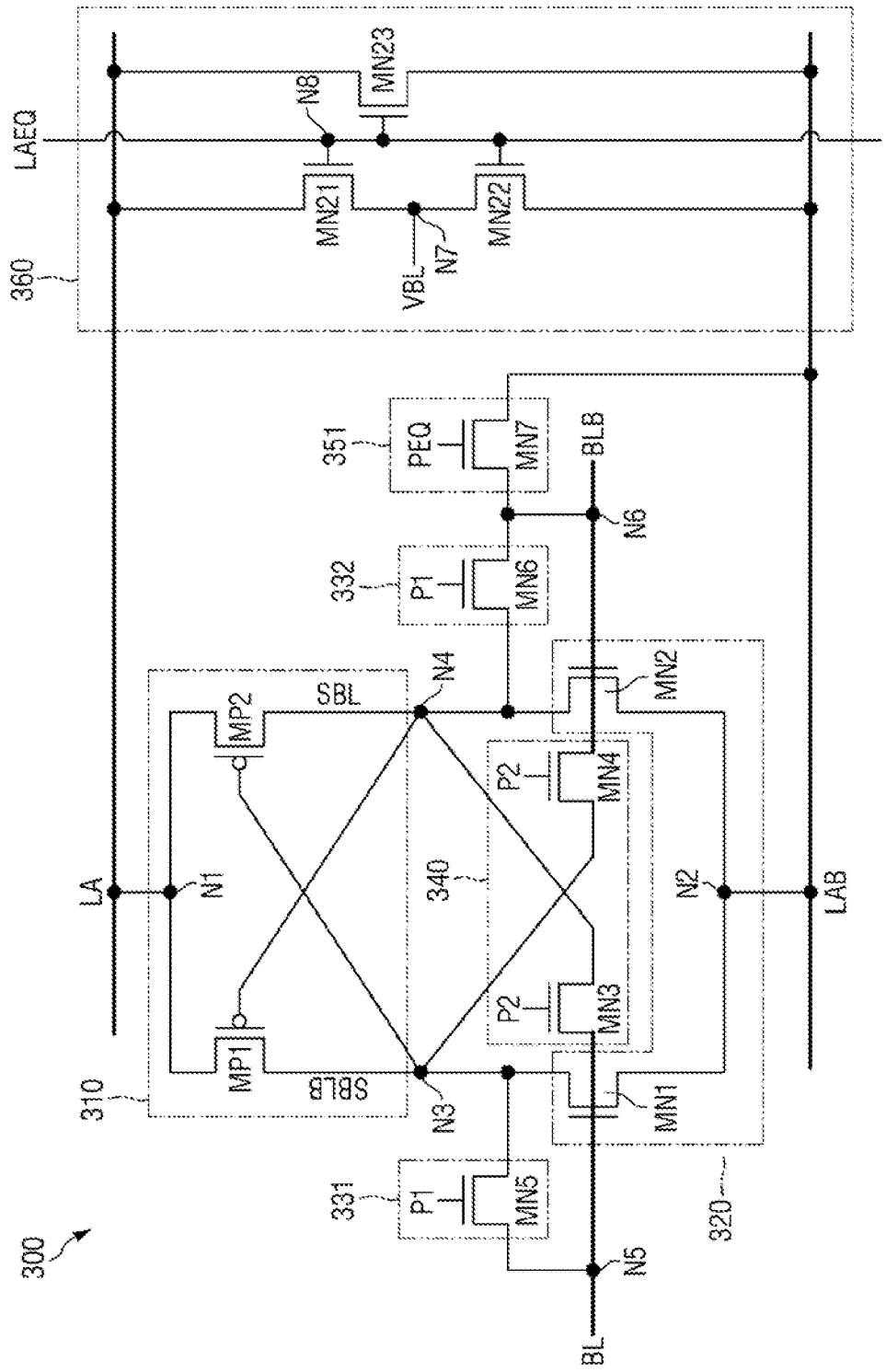
FIG. 4 is a circuit diagram showing a bitline sense amplifier according to some embodiments of the present inventive concept.

FIG. 4 is a circuit diagram showing a bitline sense amplifier according to some embodiments of the present inventive concept.

Referring to FIG. 4, a bitline sense amplifier 300 includes amplifiers 310 and 320 and an equalizer 360.

According to some embodiments of the present inventive concept, the amplifiers 310 and 320 are connected between a first supply line (LA line, N1) to which a first control signal LA is supplied and a second supply line (LAB line, N2) to which a second control signal LAB is supplied, and between a first bitline BL and a second bitline BLB. The bitline sense amplifier 300 include a P-type amplifier 310 having one end connected to a first node N1, and an N-type amplifier 320 having one end connected to a second node N2. The other ends of each of the P-type amplifier 310 and the N-type amplifier 320 may be electrically connected through a third node N3 and a fourth node N4. The third node N3 and the fourth node N4 may also be referred to as first and second cross-coupling nodes, respectively. The P-type amplifier 310 includes a transistor MP1 and a transistor MP2, and the N-type amplifier 320 includes a transistor MN1 and a transistor MN2. The transistor MP1 and the transistor MP2 are connected to each other, and the transistor MN1 and the transistor MN2 are connected to each other by a cross-coupling structure. The N-type amplifier 320 is also connected to the first bitline BL and the second bitline BLB.

For example, the transistor MP1 is connected between the first node N1 and the third node N3, and a gate of the transistor MP1 is connected to the fourth node N4. The transistor MP2 is connected between the first node N1 and the fourth node N4, and a gate of the transistor MP2 is connected to the third node N3. The transistor MN1 is connected between the second node N2 and the third node N3, and a gate of the transistor MN1 is connected to a fifth node N5 to which the first bitline BL is connected. The transistor MN2 is connected between the second node N2 and the fourth node N4, and a gate of the transistor MN2 is connected to a sixth node N6 to which the second bitline BLB is connected.

According to some embodiments of the present inventive concept, the bitline sense amplifier 300 further includes offset removal circuits 331 and 332.

The offset removal circuits 331 and 332 perform an offset removal operation that occurs between the first bitline BL and a second sensing bitline SBLB, or between the second bitline BLB and a first sensing bitline SBL. The offset removal circuits 331 and 332 may include a first offset transistor MN5 and a second offset transistor MN6. The first offset transistor MN5 is connected between the fifth node N5 and the third node N3 to connect or disconnect the first bitline BL and the second sensing bitline SBLB in accordance with an offset control signal P1. The second offset transistor MN6 is connected between the sixth node N6 and the fourth node N4 to connect or disconnect the second bitline BLB and the first sensing bitline SBL in accordance with the offset control signal P1.

According to some embodiments of the present inventive concept, the bitline sense amplifier 300 further includes an isolating circuit 340. The isolating circuit 340 connects or disconnects the first bitline BL and the first sensing bitline SBL, or the second bitline BLB and the second sensing bitline SBLB in accordance with an isolation control signal P2. The isolating circuit 340 includes an isolation transistor MN3 and an isolation transistor MN4. The isolation transistor MN3 is connected between the fifth node N5 and the fourth node N4 to connect or disconnect the first bitline BL and the first sensing bitline SBL in accordance with the isolation control signal P2. The isolation transistor MN4 is connected between the sixth node N6 and the third node N3 to connect or disconnect the second bitline BLB and the second sensing bitline SBLB in accordance with the isolation control signal P2.

The equalizer 360 is connected between the first supply line (LA line) and the second supply line (AB line), in other words, between the first node N1 and the second node N2, and pre-charges the first bitline BL and the second bitline BLB with a precharge voltage VBL in accordance with a second equalizing control signal PEQ. The equalizer 360 includes a transistor MN21 connected between the first node N1 and a seventh node N7, a transistor MN22 connected between the second node N2 and the seventh node N7, and a transistor MN23 connected between the first node N1 and the second node N2. Each of gates of the transistors MN21, MN22, and MN23 is connected to the eighth node N8, a first equalizing control signal LAEQ is applied to each of the gate, and the precharge voltage VBL is provided to the seventh node N7.

According to some embodiments of the present inventive concept, the equalizer 360 further includes an equalizing enable transistor 351. For example, when the equalizing enable transistor 351 is an N-type transistor, the equalizing enable transistor 351 connects or disconnects the second bitline BLB and the second supply line (AB line) in accordance with the second equalizing control signal PEQ, to perform the equalizing operation. Although FIG. 4 illustrates that the equalizing enable transistor 351 is connected between the second bitline BLB and the second supply line (AB line) to pre-charge the second bitline, the equalizing enable transistor 351 may also be connected to the first bitline BL to pre-charge the first bitline, according to another example.

Figure 5:
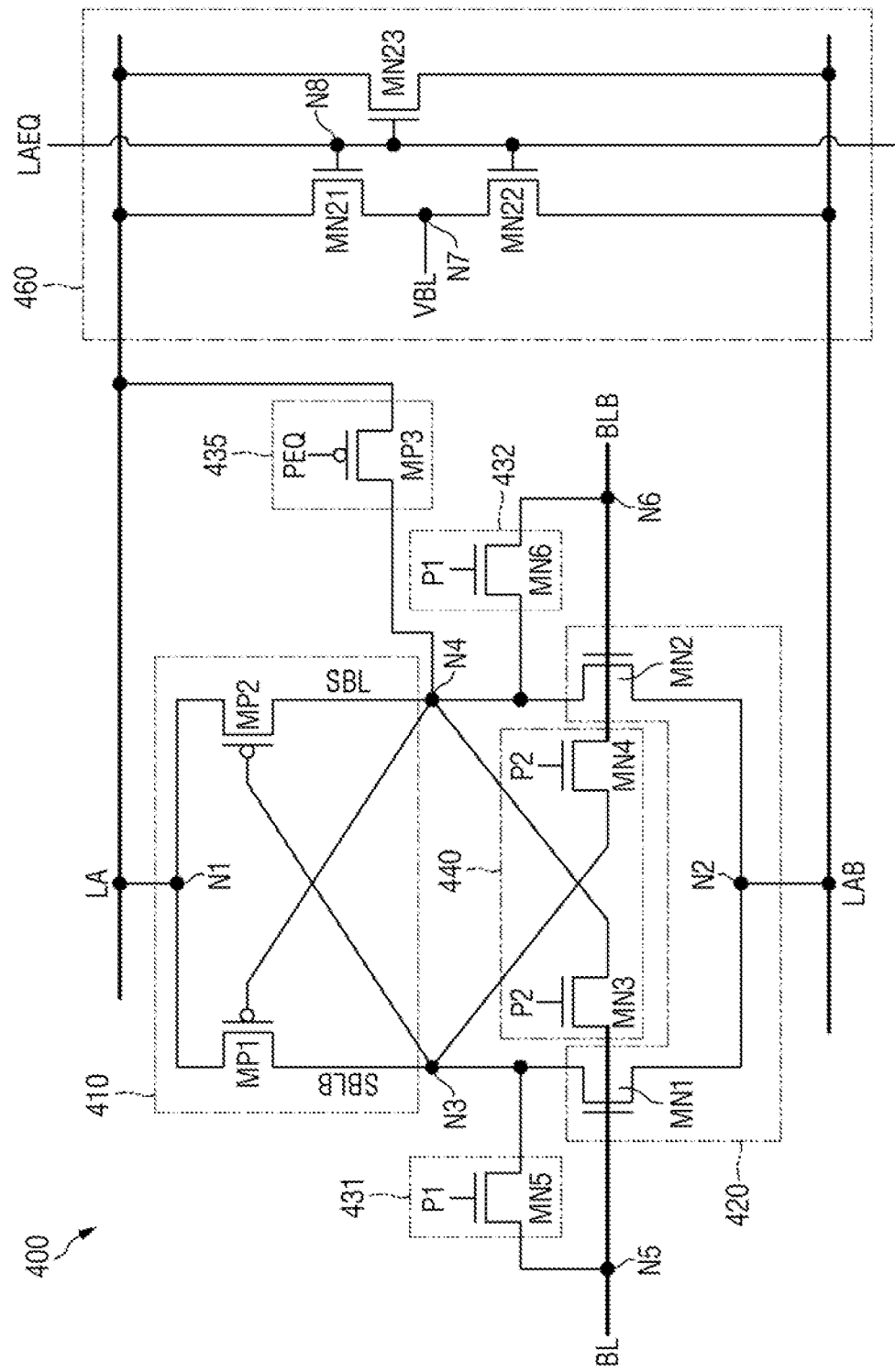
FIG. 5 is a circuit diagram showing the bitline sense amplifier according to some embodiments of the present inventive concept.

FIG. 5 is a circuit diagram showing a bitline sense amplifier according to some embodiments of the inventive concept. Repeated explanation of FIG. 4 will be omitted, and differences will be mainly explained.

Referring to FIG. 5, a bitline sense amplifier 400 further includes amplifiers 410 and 420 and an equalizer 460. However, unlike FIG. 4, an equalizing enable transistor 435 included in the equalizer 461 may be implemented as a P-type transistor.

The equalizing enable transistor 435 is connected between the fourth node N4 and the first node N1 and connects or disconnects the first supply line (LA line) and the first sensing bitline SBL in accordance with the second equalizing control signal PEQ, to perform the equalizing operation.

Figure 6:
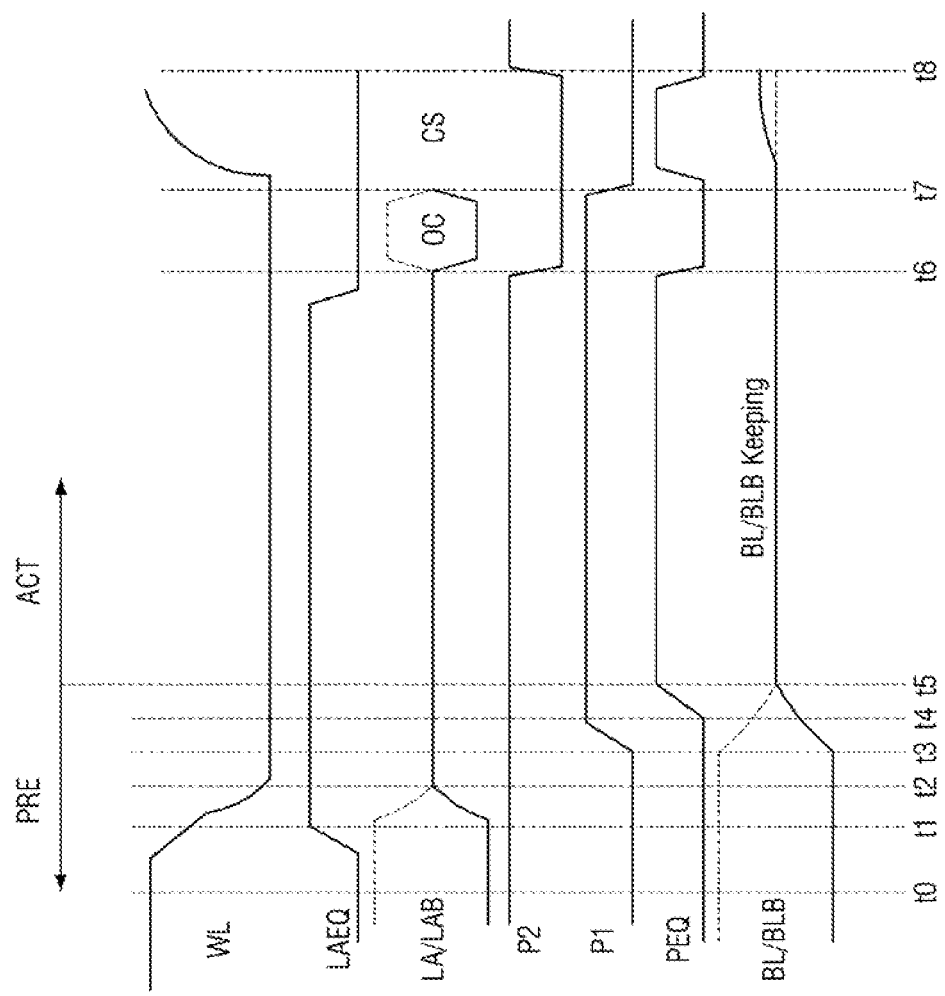
FIG. 6 shows an operation timing diagram of the bitline sense amplifier shown in FIG. 4 or FIG. 5.

FIG. 6 shows an operation timing diagram of the bitline sense amplifier 400 shown in FIG. 4. An X-axis of FIG. 6 indicates time, and a Y-axis indicates voltage levels of each signal.

The bitline sense amplifier 400 sequentially performs a precharge operation, an offset removal operation, a charge sharing operation, a pre-sensing operation, and a re-storing operation. In the following description, the precharge operation will be mainly described.

Referring to FIGS. 4 and 6, after the re-storing operation is performed until time t0, the memory cell is inactivated (e.g., WL starts transitioning from logic high to logic low), and when the first equalizing control signal LAEQ changes from logic low to logic high at time t1, the transistors MN21, MN22 and MN23 of the equalizers 360 and 460 are turned on and start to equalize the first control signal LA and the second control signal LAB. At this time, the equalizing voltage of the first control signal LA and the second control signal LAB may converge to a precharge voltage VBL supplied through the seventh node N7 at the time t2.

At the section between the time t3 and the time t4, the isolation control signal P2 is continuously in the state of maintaining the logic high, and the offset control signal P1 transitions from the logic low to the logic high. The isolation control signal P2 turns on the transistors MN3 and MN4, and the offset control signal P1 turns on the offset transistors MN5 and MN6. The signal of the fifth node N5 of the first bitline BL is input to the gate of the transistor MP2 through the third node N3, and the signal of the sixth node N6 of the second bitline BLB is input to the gate of the transistor MP1 through the fourth node N4. Further, the third node N3 and the sixth node N6 are connected, and fourth node N4 and the fifth node N5 are connected, by the transistor MN3 and the transistor MN4. Accordingly, the voltage levels of the first bitline BL and the second bitline BLB gradually start the transition by the first control signal LA and the second control signal LAB connected to each of the first and second nodes N1 and N2.

When the second equalizing signal PEQ becomes logic high at time t5, the transistor MN7 is turned on and the second bitline BLB is pre-charged with the equalizing voltage of the second supply line (e.g., LAB line). Although FIG. 6 shows that the first bitline BL and the second bitline BLB converge to the precharge voltage at the same time, the transistors MP1 and MP2 that drive the first bitline BL and the second bitline BLB may converge at the same time point or converge at the different time points, depending on their respective current drive capabilities.

At the time t6 after the time t5, when the first equalizing signal LAEQ first becomes logic low and the transistors MN21, MN22, and MN23 are turned off, and then the isolation control signal P2 becomes logic low, the transistors MN3 and MN4 are turned off, and when the second equalizing signal PEQ also becomes logic low, the transistor MN7 is also turned off. Accordingly, the first and second bitlines BL and BLB are each separated in the pre-charged state, and in the state in which only the offset control signal P1 is in the logic high state, the transistors MN5 and MN6 are turned on, and an offset canceling operation OC is performed.

When the offset control signal P1 becomes logic low and the voltage level of the word line becomes logic high at the time t7, the memory cell belonging to that word line is subjected to a charge sharing operation when the second equalize signal PEQ becomes logic high during the section between the time t7 and the time t8. After that, the memory cell MC may change depending on the amount of electric charge stored in the capacitor C.

Figure 7:
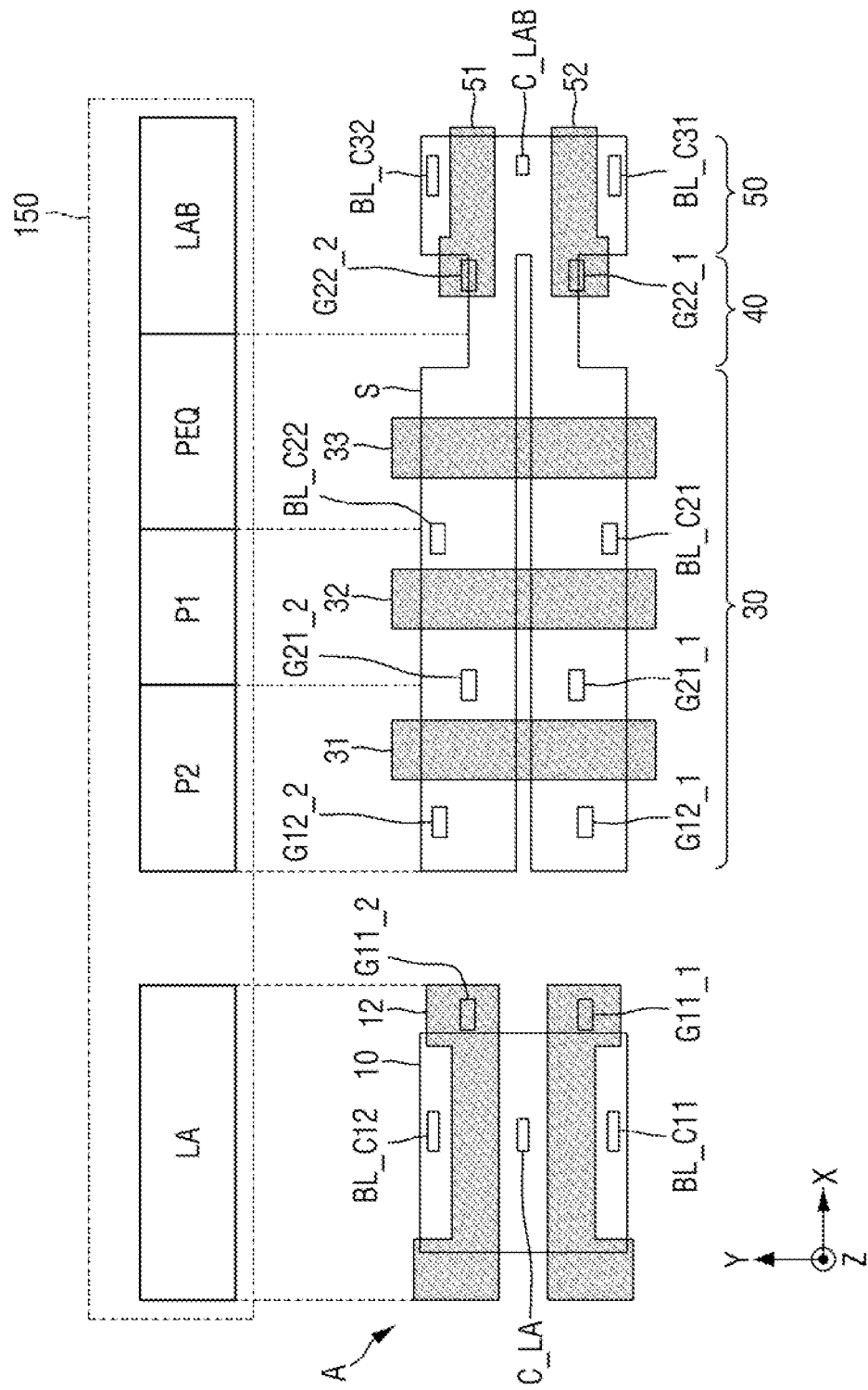
FIG. 7 is a diagram showing a layout of the bitline sense amplifier according to some embodiments of the present inventive concept.
Figure 8:
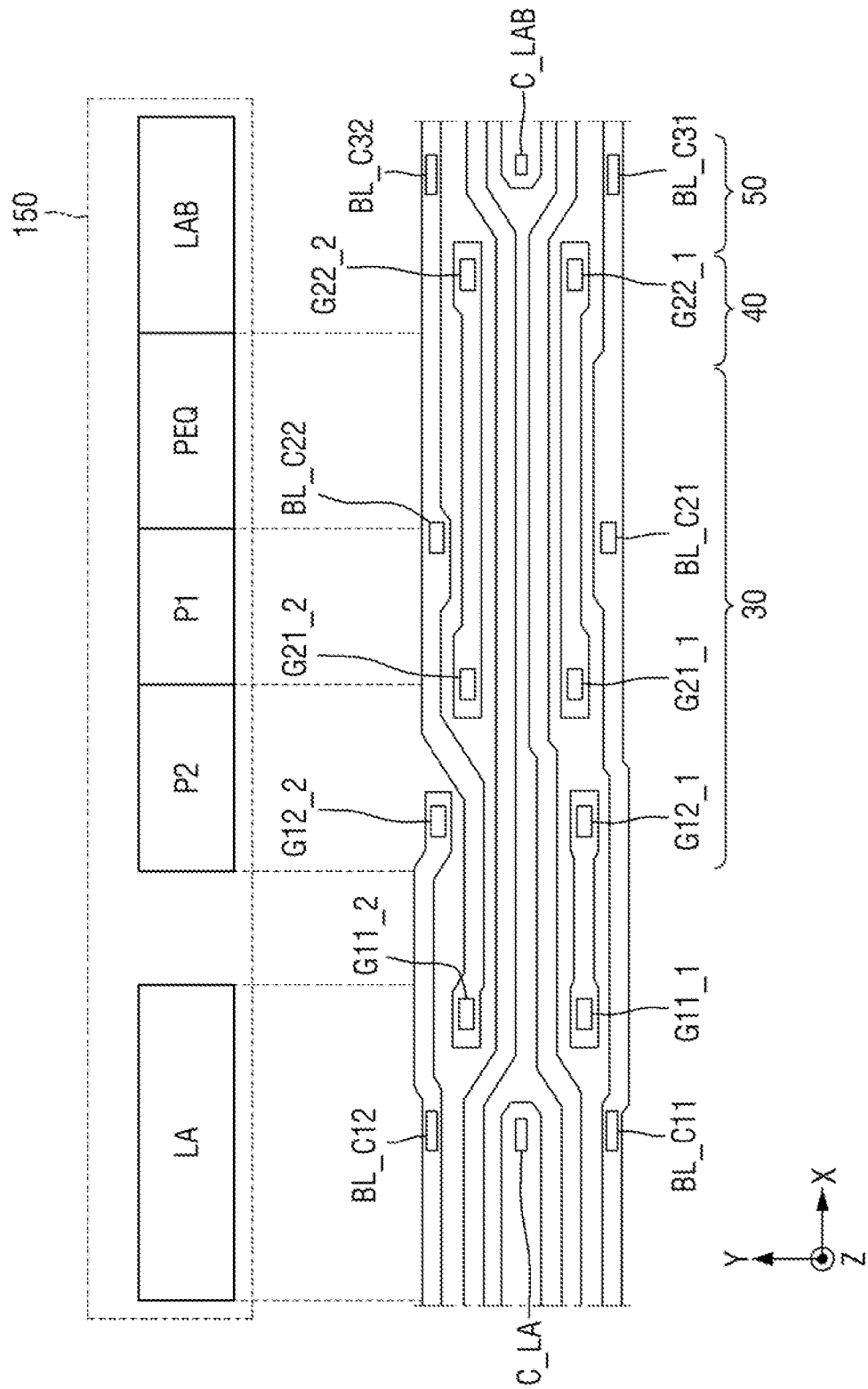
FIG. 8 shows a bitline layout connected to the bitline sense amplifier shown in FIG. 7.
Figure 9:
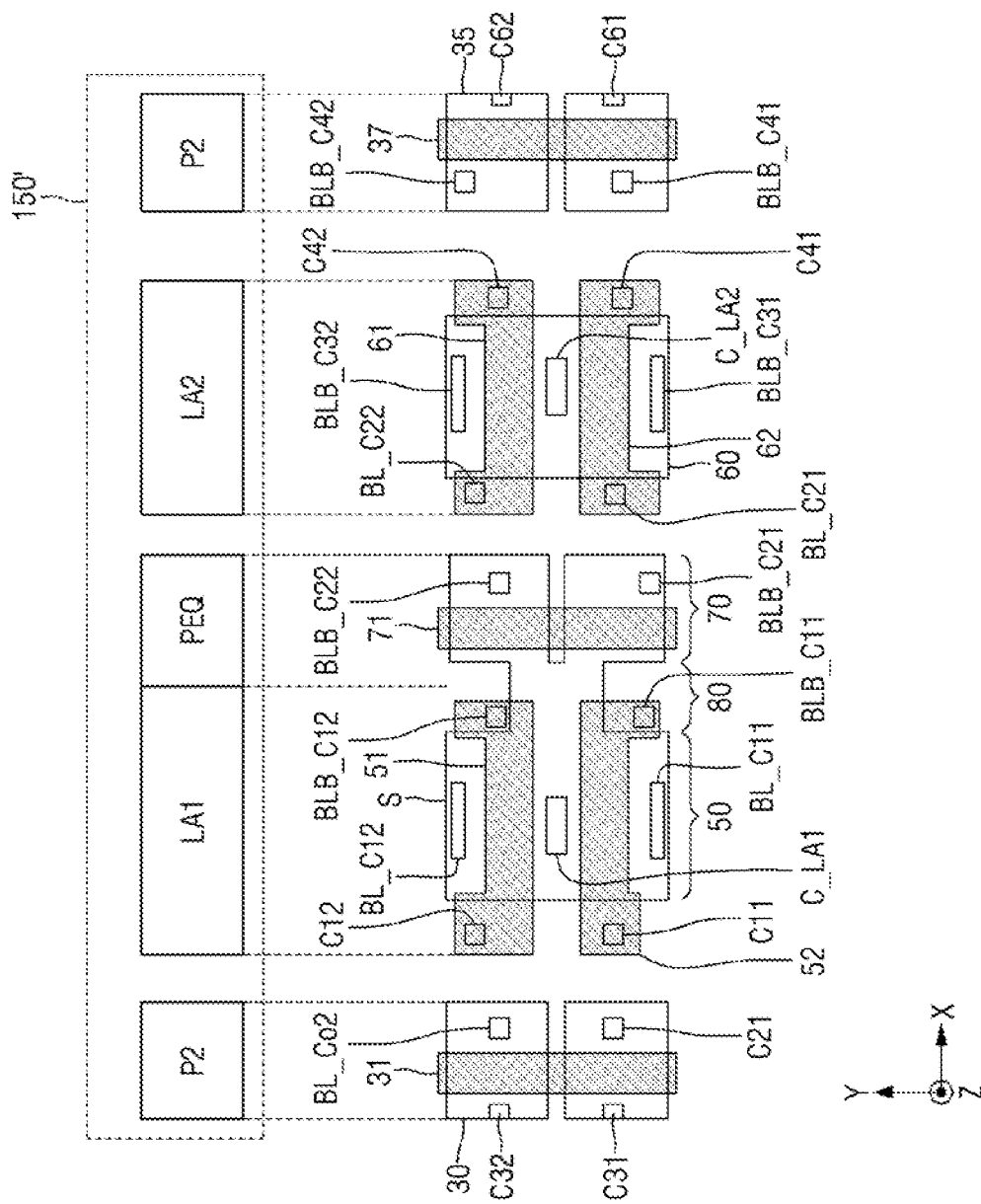
FIG. 9 is a diagram showing a layout of the bitline sense amplifier according to some embodiments of the present inventive concept.

Although the above description has been provided primarily on the basis of FIG. 4, it is assumed that FIG. 5 also similarly operates. However, since the equalizing enable transistor MP3 is a P-type, the second equalizing control signal PEQ may operate the equalizing enable transistor MP3 with a phase opposite to that shown in FIG. 6. FIGS. 7 to 9 are diagrams showing a Back End Of Line BEOL) layout of a bitline sense amplifier according to an embodiment of the inventive concept. The equalizing enable transistor will be mainly described. A source of the equalizing enable transistor is connected to the first supply line (LA line) as an example, and the equalizing enable transistor may include an active region which is common to the active region of the transistor (e.g., a P-type active pattern) that supplies the first control signal LA. As another example, the source of the equalizing enable transistor may be connected to the second supply line (AB line), and the equalizing enable transistor may include an active region which is common to the active region of the transistor (e.g., N-type active pattern) that supplies the second control signal LAB. In the shown bitline sense amplifier 150 and 150', a PEQ region in which the equalizing enable transistor is formed and a LAB region which is formed with a transistor to which the second control signal is supplied share the N-type active region. However, because the signals applied to each of gate patterns 33, 51 and 52 are only different, the area of the independent active region for the source or drain of the equalizing enable transistor may decrease, and the number of line pattern patterns may decrease accordingly. In other words, the memory cell array and the bitline sense amplifier array may be designed with an entire efficient area.

Hereinafter, embodiments of a layout of the bitline sense amplifier according to some embodiments of the inventive concept will be described in FIGS. 7 to 14.

FIG. 7 is a diagram showing the layout of the bitline sense amplifier according to some embodiments of the inventive concept, and FIG. 8 shows the bitline layout connected to the bitline sense amplifier shown in FIG. 7.

Referring to FIG. 7, according to some embodiments of the inventive concept, the bitline sense amplifier 150 includes a first P-type active region 10 and a second N-type active region S.

The P-type active region 10 may be placed on a substrate in a rectangular active pattern in an X-direction. The N-type active region S may be spaced apart from the P-type active region 10 in the X-direction on the substrate, and may be placed in an active pattern in the form of a fork. For example, the N-type active region S may have the shape of a tuning fork.

Contacts BL_C11 and BL_C12 for connecting to a bitline metal pattern including a bitline BL or complementary bitline BLB, and a contact C_LA for connecting to the first control signal LA metal pattern may be formed over the P-type active region 10.

According to some embodiments of the present inventive concept, the N-type active region S includes a first region 30 which has spaced portions on the substrate and extends parallel in the X-direction, a second region 40 which has spaced portions connected to the spaced portions of the first region 30 and is parallel and has a narrower width than the first region, and a third region 50 that connects the spaced portions of the second region. As an example, the first region 30 may be a pair of active patterns placed at both ends of the spaced portions of the second region 40 in the Y-direction. The second region 40 is a pair of active patterns placed at both ends of the spaced portions of the first region 30 in the Y-direction, but may have a narrower width than that of the active pattern of the first region 30. The first region 30, the second region 40, and the third region 50 have the different cross sections in the Z direction, but may be patterns connected to each other as common regions.

Contacts G12_1, G12_2, G21_1, G21_2, BL_C21 and BL_C22 for connecting to a bitline metal pattern including the bitline BL or the complementary bitline BLB may be formed on the first region 30. Contacts BL_C31 and BL_C32 for connecting to a bitline metal pattern including the bitline BL or the complementary bitline BLB may be formed on the third region 50. A contact C_LAB for connecting to the second control signal LAB metal pattern may be formed in a central region in the Y-direction on the third region 50 (for example, on the same line as the contact C_LA).

According to some embodiments of the present inventive concept, the bitline sense amplifier may include a plurality of gate patterns. For example, the bitline sense amplifier includes a first gate pattern pair 12, second gate pattern pairs 51 and 52, a first gate pattern 31, a second gate pattern 32, and a third gate pattern 33.

The first gate pattern pairs 12 are spaced apart from each other in the Y-direction, while being placed to extend in the X-direction. A spaced distance between the first gate pattern pairs 12 is wider than the spaced portions of the first and second regions 30 and 40 (which are active patterns) and is narrower than the length of the first region 10 (which is a P-type active region) in the Y-direction. The first control signal LA is supplied to the first gate pattern pair 12.

Gate contacts G11_1 and G11_2 may be formed on the first gate pattern pair 12, respectively.

Therefore, the P-type first region 10, the first gate pattern pair 12, and the contacts BL_C11 and BL_C12 may form a MP1 transistor and a MP2 transistor of FIG. 4, respectively. The gate contacts G11_1 and G11_2 may be connected to the third and fourth nodes N3 and N4, respectively.

The second gate pattern pairs 51 and 52 are spaced apart from each other in the Y-direction, while being placed to extend in the X-direction. A spaced distance between the second gate pattern pairs 51 and 52 is the same as the spaced distance between the first gate pattern pairs 12, and is wider than the spaced portions of the first and second regions 30 and 40, but is narrower than the length of the P-type first region 10 in the Y-direction.

The first gate pattern 31, the second gate pattern 32, and the third gate pattern 33 are placed to extend in the Y-direction on the first region 30 of the N-type active region S, and are placed to be spaced apart by a predetermined distance in the X-direction. The first gate pattern pair 12 and the second gate pattern pairs 51 and 52 may be cut to a predetermined length so as not to be connected to other gate patterns (e.g., the first, second and third gate patterns 31, 32 and 33).

For example, the isolation control signal P2 may be applied to the first gate pattern 31, the offset control signal P1 may be applied to the second gate pattern 32, and a second equalizing control signal PEQ may be applied to the third gate pattern 33. However, according to other examples, the order of the signals applied to each of the first gate pattern 31, the second gate pattern 32 and the third gate pattern 33 may be changed.

The second gate pattern pairs 51 and 52 may be the gate patterns of an adjacent bitline sense amplifier. Gate contacts G22_1 and G22_2 may be formed on the second gate pairs 51 and 52, and the gate contacts G22_I and G22_2 may be connected to the third and fourth nodes N3 and N4, respectively. In other words, the third region 50, the second gate pattern pairs 51 and 52, and the gate contact G22_1 and G22_2 may form the MN1 transistor and the MN2 transistor of FIG. 4.

Referring to FIG. 8, the contacts BL_C11, BL_C12, G11_1, G11_2, G12_1, G12_2, G21_1, G21_2, BL_C21, BL_C22, G22_1, G22_2, BL_C31 and BL_C32 and the control signal contacts C_LA and C_LAB shown in FIG. 7 may be placed at the same position below the bitline metal pattern shown in FIG. 8.

Accordingly, since the active region of the first region 30 is applied with the second control signal LAB and shared without another active region for the equalizing enable transistor (PEQ, 150, MN7 of FIG. 4), the number of bitline metal patterns on the PEQ region may decrease.

Figure 10:
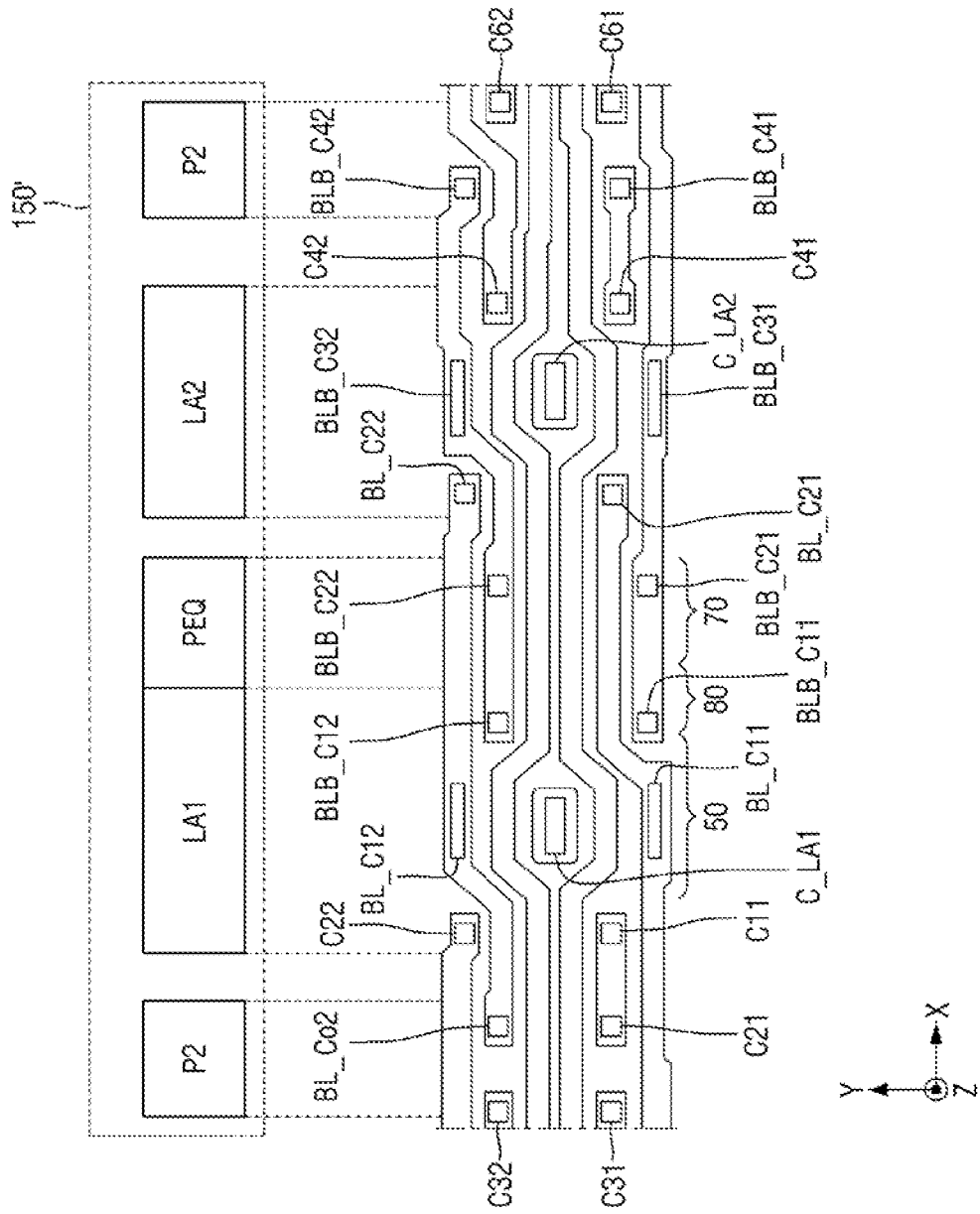
FIG. 10 shows the bitline layout connected to the bitline sense amplifier shown in FIG. 9.

FIG. 9 is a diagram showing the layout of the bitline sense amplifier according to some embodiments of the present inventive concept, and FIG. 10 shows the bitline layout connected to the bitline sense amplifier shown in FIG. 9.

Referring to FIG. 9, in the bitline sense amplifier, unlike FIG. 7, the isolation transistors MN3 and MN4 and the equalizing enable transistor may have an active region independent of each other. The equalizing enable transistor shown in FIG. 8 is an N-type transistor, and may be the equalizing enable transistor MN7 shown in FIG. 4.

For example, a bitline sense amplifier 150' may include a first N-type active region S, a P-type active region 60, a second N-type active region 30, and a third N-type active region 35, on a substrate.

According to some embodiments of the inventive concept, the spaced distance in the X-direction between the active regions may be the same or different depending on the shape of the gate pattern. According to some embodiments of the inventive concept, the spaced distance in the X-direction of the active regions between different types (P-type, N-type) may be greater than the spaced distance in the X-direction of the active regions between the same types.

The first N-type active region S may be divided into a first region 50, a second region 80, and a third region 70. The first region 50 is placed in a rectangular shape in the X-direction, and the second region 80 may be a rectangular pattern that has a narrower length in the Y-direction, in other words, a width, than the first region 50. The third region 70 may be placed in a pair of active pattern structures extending parallel in the X-direction at both ends of spaced portions thereof in the Y-direction. The first region 50, the second region 80 and the third region 70 have different cross sections in the Z direction, but may be patterns connected to each other as common region.

Contacts BL_C11 and BL_C12 may be formed on the first region 50 of the first N-type active region S. Further, a control signal contact C_LA1 is formed on the first region 50, and a control signal LA1 (e.g., a LAB signal) may be applied thereto. Contacts BLB_C21 and BLB_C22 may be formed on the third region 70.

The P-type active region 60 has one side (a right boundary of the P-type active region) spaced apart from one side (for example, a left boundary) of the first N-type active region S in the X-direction, and may be placed in a rectangular structure in the X-direction. Contacts BLB_C31 and BLB_C32 may be formed on the P-type active region 60, and a control signal contact C_LA2 to which a control signal LA2 (e.g., LA signal) is applied may be formed.

The second N-type active region 30 is spaced apart from the P-type active region 60 in the X-direction to face the other side (e.g., the left boundary of the P-type active region 60) in the X-direction of the P-type active region 60, and may be placed as an active pattern pair 30 which extends parallel in the X-direction and includes two spaced portions in the Y-direction. Contacts C31, C32, C21 and BL_Co2 may be formed on the second N-type active region 30. In other words, the contacts C21 and BL_Co2 of the second N-type active region 30 are connected to the bitline BL, and may become the MN3 transistor of FIG. 4 together with the gate pattern 31.

The third N-type active region 35 has one side placed to be spaced apart from the other side (e.g., the right boundary) in the X-direction of the first N-type active region S, and may be placed as the active pattern pair 35 that extends parallel in the X-direction and includes spaced portions in the Y-direction. In this case, the spaced portions of the second N-type active region 30 and the spaced portions of the third N-type active region 35 may have the same spaced distance in the Y-direction. Contacts C61, C62, BLB_C41 and BLB_C42 may be formed on the third N-type active region 35. In other words, the contacts BLB_C41 and BLB_C42 of the third N-type active region 35 are connected to the complementary bitlines BLB, and may become the MN4 transistor of FIG. 4 together with gate pattern 37.

The bitline sense amplifier 150' may include the plurality of gate patterns on the plurality of active regions. For example, bitline sense amplifier 150' may include a first gate pattern 71, first gate pattern pairs 51 and 52, second gate pattern pairs 61 and 62, a second gate pattern 31, and the third gate pattern 37.

The first gate pattern 71, the second gate pattern 31, and the third gate pattern 37 are a single pattern extending in the Y-direction, and the first gate pattern pairs 51 and 52 and the second gate pattern pairs 61 and 62 may be a pair of gate patterns extending in the X-direction. The first gate pattern pairs 51 and 52 and the second gate pattern pairs 61 and 62 may be cut to a predetermined length so as not to be connected to other gate patterns (e.g., the second, first and third gate patterns 31, 71 and 37).

The first gate pattern pairs 51 and 52 are spaced apart from each other in the Y-direction, while being placed to extend in the X-direction. A spaced distance between the first gate pattern pairs 51 and 52 is wider than the spaced portions of the active pattern 70, but is narrower than the length of the first N-type active region S in the Y-direction. Gate contacts C11, C12, BLB_C11 and BLB_C12 may be formed on each of the first gate pattern pairs 51 and 52.

The second gate pattern pairs 61 and 62 are spaced apart from each other in the Y-direction, while being placed to extend in the X-direction. The spaced distance between the second gate pattern pairs 61 and 62 is the same as the spaced distance between the first gate pattern pairs 51 and 52, and is wider than the spaced portions of the second and third N-type active regions 30 and 35, but is narrower than the length of the second and third N-type active regions 30 and 35 in the Y-direction. Gate contacts BL_C21, BL_C22, C41 and C42 may be formed on each of the second gate pattern pairs 61 and 62.

The first gate pattern 71 is placed on the third region 70 to extend along the Y-axis, and a second equalizing control signal PEQ is applied thereto. The second gate pattern 31 is placed on the second N-type active region 30 to extend along the Y-axis, and an isolation control signal P2 is applied thereto. The third gate pattern 37 is placed on the third N-type active region 35 to extend along the Y-axis, and the isolation control signal P2 is applied thereto.

Referring to FIG. 10, the contacts C31, C32, C21, BL_Co2, BL_C21, BL_C22, BL_C11, BL_C12, BLB_C21, BLB_C22, BLB_C31, BLB_C32, BLB_C41, BLB_C42, C61 and C62 and the control signal contacts C_LA1 and C_LA2 shown in FIG. 9 may be placed at the same position below the bitline metal pattern shown in FIG. 10.

Accordingly, since the first N-type active region S is applied with the second control signal LAB and shared without a separate active region for the equalizing enable transistor (PEQ, 150, MN7 of FIG. 4), the number of bitline metal patterns on the PEQ region may decrease.

Figure 11:
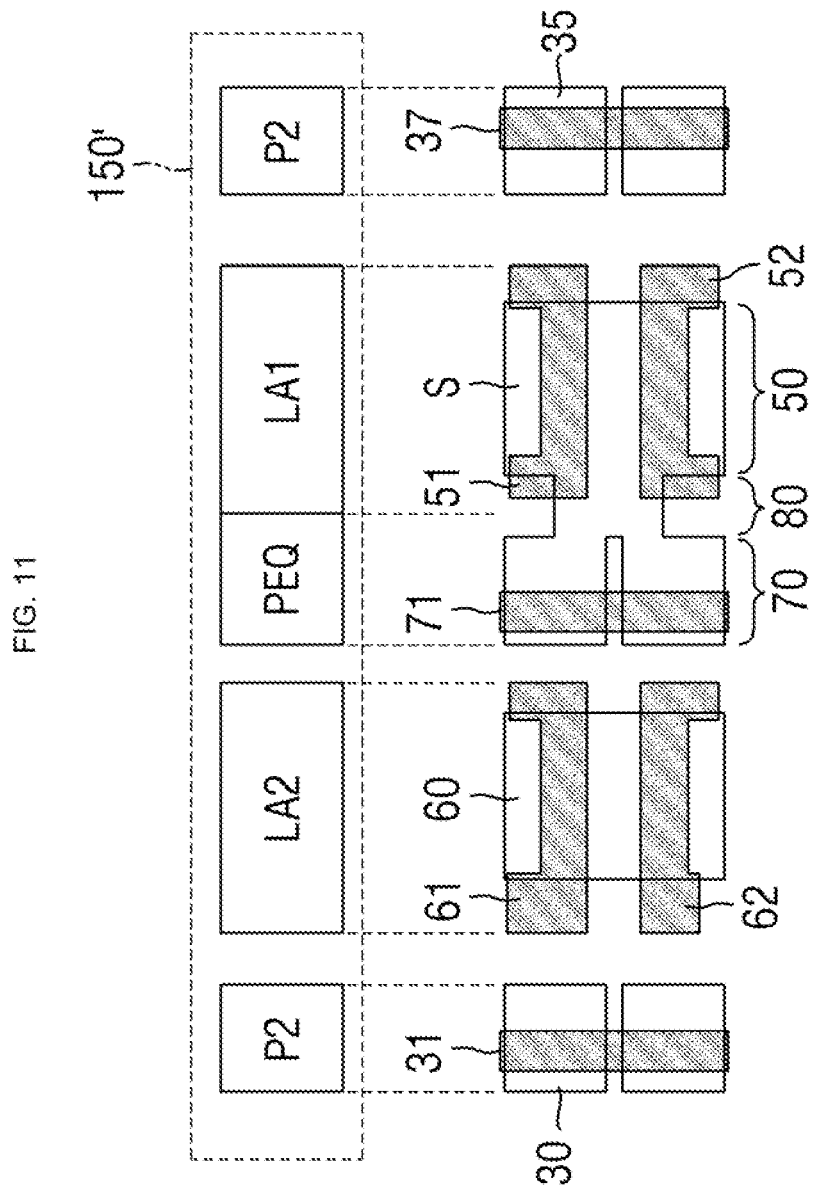
FIG. 11 is a diagram showing a layout of a bitline sense amplifier according to some embodiments of the present inventive concept.

FIG. 11 is a diagram showing a layout of a bitline sense amplifier according to some embodiments of the present inventive concept.

Referring to FIG. 11, in the bitline sense amplifier 150', unlike FIG. 7, the offset transistors MN3 and MN4 and the equalizing enable transistor may have an active region independent of each other. Further, unlike FIG. 9, the equalizing enable transistor shown in FIG. 11 is a P-type transistor, and may be an equalizing enable transistor MP3 shown in FIG. 5.

For example, the bitline sense amplifier 150' may include a P-type active region S, a first N-type active region 60, a second N-type active region 30, and a third N-type active region 35 on a substrate.

According to some embodiments of the inventive concept, a spaced distance in X-direction between the active regions may be the same or different depending on the shape of the gate pattern. According to some embodiments of the inventive concept, the spaced distance in the X-direction of the active regions between different types (e.g., P-type, and N-type) may be greater than the spaced distance in the X-direction of the active region between the same types.

The P-type active region S may be divided into a first region 50, a second region 80, and a third region 70. The first region 50 is placed in a rectangular shape in the X-direction, the second region 80 may be a rectangular pattern that has a narrower length in the Y-direction, in other words, a width, than the first region 50. The third region 70 may be placed in a pair of active pattern structures extending parallel in the X-direction and have spaced portions in the Y-direction. The first region 50, the second region 80, and the third region 70 have different cross sections in the Z direction, and may be patterns connected to each other as common regions. However, unlike the arrangement order in the X-direction of the active region S of FIG. 9, in which the first region 50, the second region 80, and the third region 70 are placed from left to right, the first region 50, the second region 80, and the third region 70 are arranged from right to left in FIG. 11.

The first N-type active region 60 has one side (the right boundary of the first N-type active region 60) that is spaced apart from one side (e.g., the left boundary) of the P-type active region S in the X-direction, and may be placed in a rectangular structure in the X-direction.

The second N-type active region 30 is spaced apart from the P-type active region S in the X-direction to face the other side in the X-direction (e.g., the left boundary of the P-type active region S) of the P-type active region S, and may be placed as an active pattern pair 30 which extends parallel in the X-direction and has spaced portions in the Y-direction.

The third N-type active region 35 has one side that is placed to be spaced apart from the other side (e.g., the right boundary) in the X-direction of the first N-type active region S, and may be placed as an active pattern pair 35 that extends parallel in the direction X and has spaced portions in the Y-direction. In this case, the spaced portions of the second N-type active region 30 and the spaced portions of the third N-type active region 35 may have the same spaced distance in the Y-direction.

The bitline sense amplifier 150' may include a plurality of gate patterns on the plurality of active regions. For example, the bitline sense amplifier 150' may include a first gate pattern 71, first gate pattern pairs 51 and 52, second gate pattern pairs 61 and 62, a second gate pattern 31, and a third gate pattern 37.

The first gate pattern 71, the second gate pattern 31, and the third gate pattern 37 are a single pattern extending in the Y-direction, and the first gate pattern pairs 51 and 52 and the second gate pattern pairs 61 and 62 may be a pair of gate patterns extending in the X-direction. The first gate pattern pairs 51 and 52 and the second gate pattern pairs 61 and 62 may be cut to a predetermined length so as not to be connected to other gate patterns (e.g., the second, first and third gate patterns 31, 71 and 37).

The first gate pattern pairs 51 and 52 are spaced apart from each other in the Y-direction, while being placed to extend in the X-direction on the first region 50. The spaced distance between the first gate pattern pairs 51 and 52 is narrower than the spaced portions of the active pattern 50, but is narrower than the length in the Y-direction of the active pattern 50. The first control signals LA and LA1 are supplied to the first gate pattern pairs 51 and 52.

The second gate pattern pairs 61 and 62 are spaced apart from each other in the Y-direction, while being placed on the first N-type active region 60 to extend in the X-direction. The spaced distance between the second gate pattern pairs 61 and 62 is the same as the spaced distance between the first gate pattern pairs 51 and 52, and is wider than the spaced portions of the second and third active patterns 30 and 35, but is narrower than the length of the active regions 50 and 60 in the Y-direction. The second control signals LAB and LA2 are supplied to the second gate pattern pairs 61 and 61.

The first gate pattern 71 is placed on the third region 70 to extend along the Y-axis, and a second equalizing control signal PEQ is applied thereto. The second gate pattern 31 is placed on the second N-type active region 30 to extend along the Y-axis, and an isolation control signal P2 is applied thereto. The third gate pattern 37 is placed on the third N-type active region 35 to extend along the Y-axis, and the isolation control signal P2 is applied thereto.

On the other hand, although contacts are not shown in FIG. 11, the embodiment of FIG. 11 may be implemented in the same manner as in the embodiment of FIG. 9, and the contacts and the bitline metal line may be connected.

Figure 12:
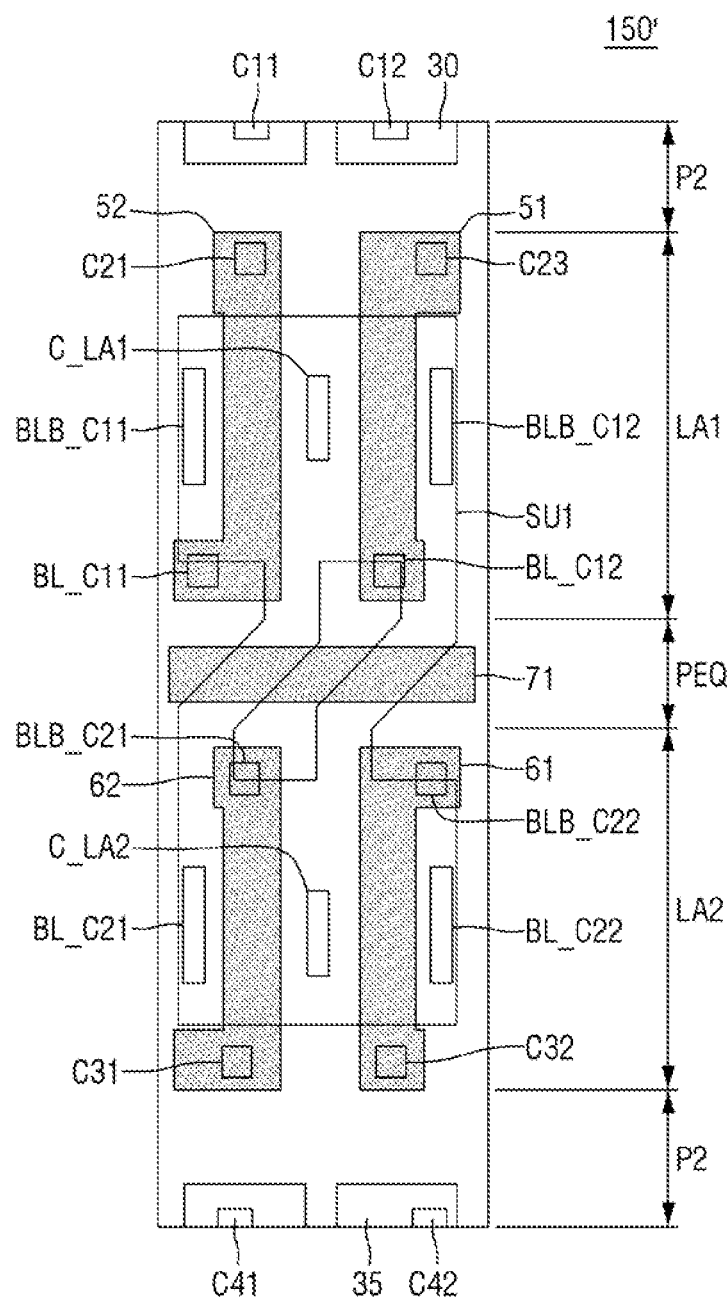
FIG. 12 is a diagram showing a layout of a bitline sense amplifier according to some embodiments of the present inventive concept.
Figure 13:
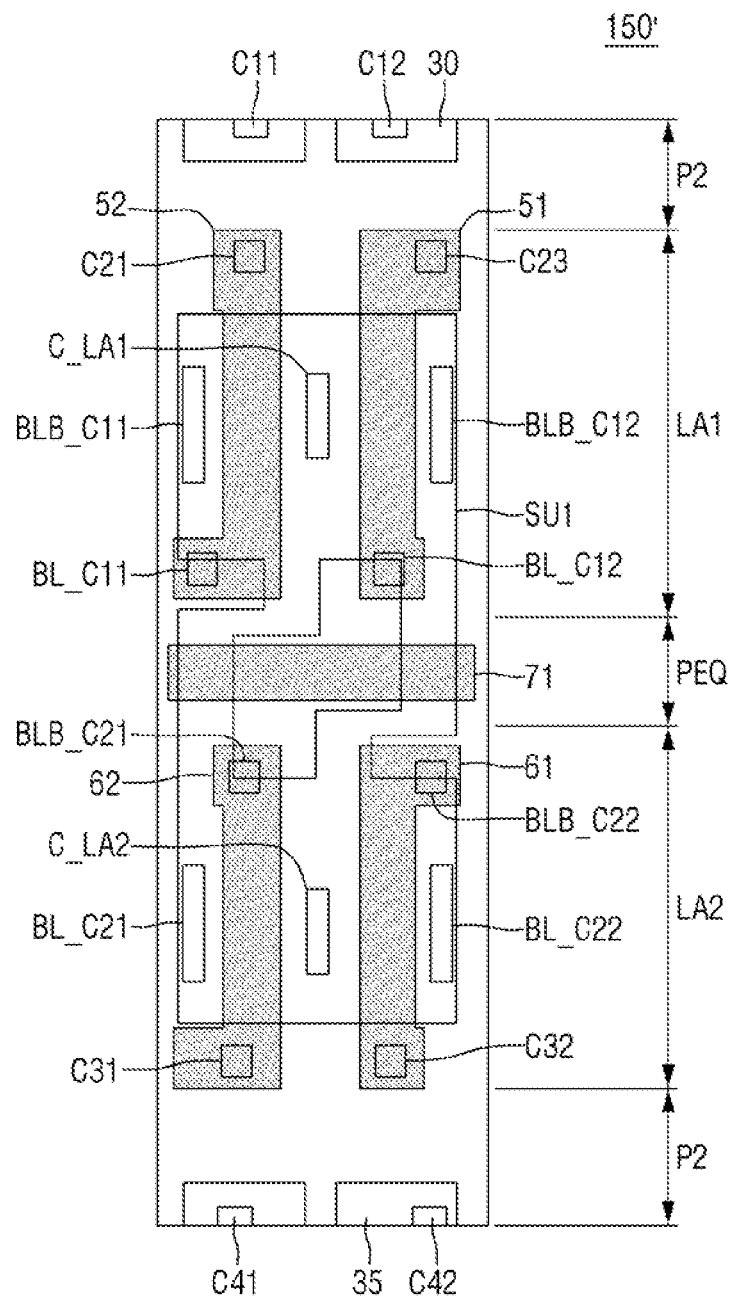
FIG. 13 is a diagram showing a layout of a bitline sense amplifier according to some embodiments of the present inventive concept.
Figure 14:
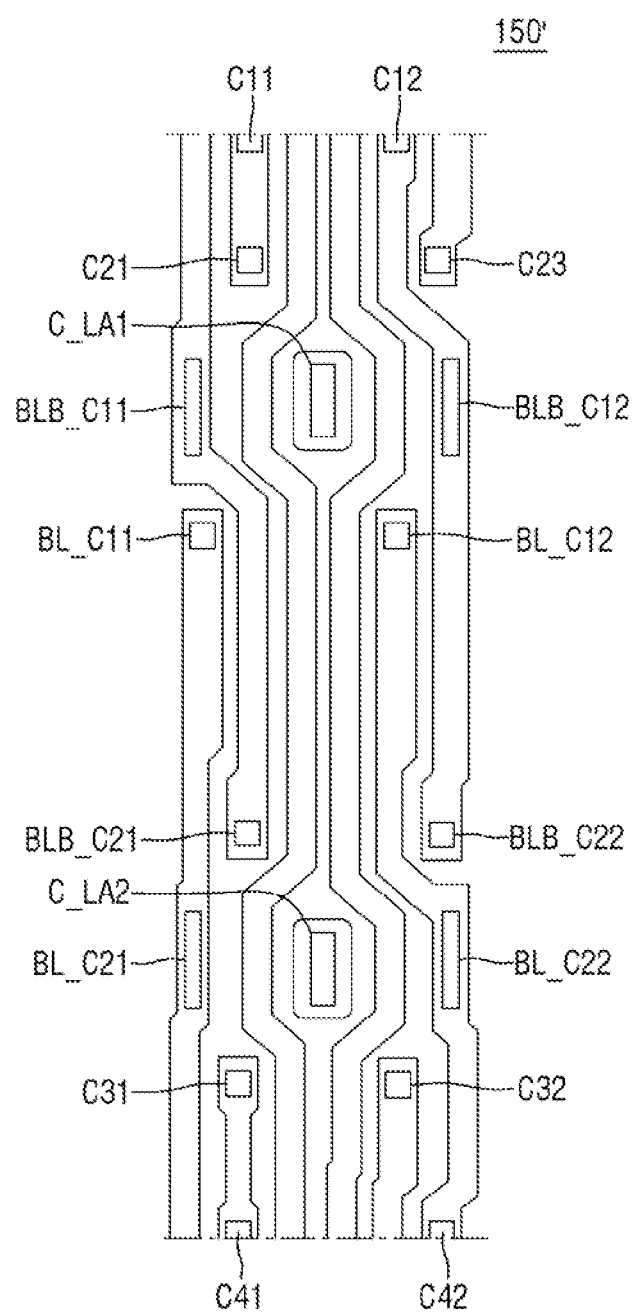
FIG. 14 shows the bitline layout connected to the bitline sense amplifier shown in FIG. 12 or 13.

FIG. 12 is a diagram showing a layout of a bitline sense amplifier according to some embodiments of the present inventive concept. FIG. 13 is a diagram showing a layout of a bitline sense amplifier according to some embodiments of the present inventive concept. FIG. 14 shows the bitline layout connected to the bitline sense amplifier shown in FIG. 12 or 13. For convenience of explanation, since the second N-type active region 30 and the third N-type active region 35 correspond to those of FIGS. 7, 9, and 11, the description thereof will not be provided.

Referring to FIG. 12, in the bitline sense amplifier 150', unlike FIG. 9 or 11, the MP1 transistor and the MP2 transistor of FIG. 4, and the MN4 and the equalizing enable transistor MP3 may share a single active region.

P-type shared active region SU1 may be divided into a LA1 region, a PEQ region and a LA2 region when viewed from the Z direction, but has different cross sections in the Z direction, and may be a pattern connected to each other as a common region.

According to some embodiments of the inventive concept, the LA1 region and the LA2 region may be P-type active regions formed in a rectangular shape on the substrate. The PEQ region may be implemented in a bridge shape that connects the rectangular LA1 region and the rectangular LA2 region at the center. For example, the PEQ region may be implemented in the form of a bridge pair that has a predetermined spaced region in the middle of the bridge shape. In this case, the bridge shape may be implemented such that is tilted diagonally between the LA1 region and the LA2 region as shown in FIG. 12. According to another embodiment of the present inventive concept, the bridge shape may be implemented in a bent (or slanted) shape only in the X-Y directions between the LA1 region and the LA2 region on the basis of the gate pattern 71, as shown in FIG. 13.

Contacts BLB_C11, BLB_C12, BL_C21 and BL_C22 connected to the bitlines or the complementary bitlines may be formed on the P-type shared active region SU1, and control signal contacts C LA1 and C LA2 to which the first control signal LA1 or the second control signal LA2 is applied may be formed.

The bitline sense amplifier 150' may include the plurality of gate patterns on the plurality of active regions. For example, the bitline sense amplifier 150' may include a first gate pattern 71, first gate patterns pairs 51 and 52, and second gate pattern pairs 61 and 62.

The first gate pattern 71 is a single pattern extending in the Y-direction, and the first gate pattern pairs 51 and 52 and the second gate pattern pairs 61 and 62 may be a pair of gate patterns extending in the X-direction. The first gate pattern pairs 51 and 52 and the second gate pattern pairs 61 and 62 may be cut to a predetermined length so as not to be connected to another gate pattern (e.g., the first gate pattern 71).

The first gate pattern pairs 51 and 52 are spaced apart from each other in the Y-direction, while being placed to extend in the X-direction. Gate contacts C21, C23, BL_C11 and BL_C12 may be formed on the first gate pattern pairs 51 and 52.

The second gate pattern pairs 61 and 62 are spaced apart from each other in the Y-direction, while being placed to extend in the X-direction. Gate contacts BLB_C21, BLB_C22, C31 and C32 may be formed on the second gate pattern pairs 61 and 62.

The first gate pattern 71 is placed on the PEQ region of the P-type shared active region SU1 to extend along the Y-axis, and a second equalizing control signal PEQ is applied thereto.

Referring to FIG. 14, the contacts C11, C12, C21, C23, BLB_C11, BLB_C12, BL_C11, BL_C12, BLB_C21, BLB_C22, BL_C21, BL_C22, C31, C32, C41 and C42, and the control signal contacts C_LA1 and C_LA2 shown in FIG. 12 or 13 may be placed at the same position below the bitline metal pattern shown in FIG. 14.

Accordingly, since the P-type shared active region SU1 is applied with the first control signal LA1 or the second control signal LA2 and shared without a separate active region for the equalizing enable transistor (PEQ, 150, MP3 of FIG. 5), the number of bitline metal patterns on the PEQ region may decrease.

In addition, compared to FIG. 9 or 11, since the LA1 region, the PEQ region, and the LA2 region are implemented as a single P-type shared active region SU, there is no need for a gap between the PEQ region and LA2 region of FIG. 9 or a gap between the PEQ region and the LA1 region of FIG. 11. Further, there is no need for separate contact and separate upper wiring for connecting a transistor formed in the LA1 region different from the MP3 transistor (e.g., the equalizing control transistor) or a transistor formed in the LA2 region. In other words, this has an effect of reducing the area on the layout of the memory cell, and it is possible to reduce the amount of wiring.

Figure 15:
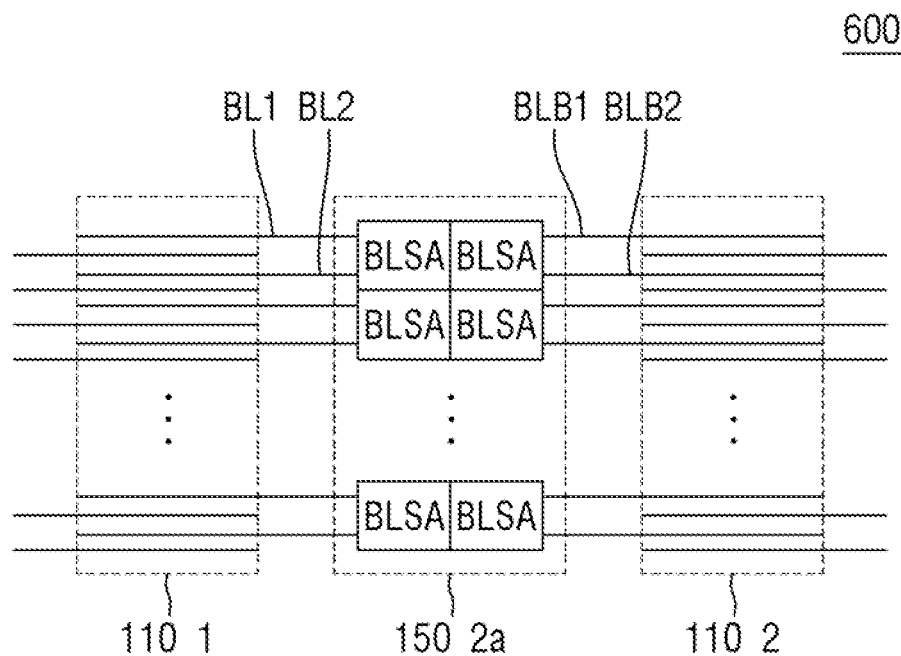
FIG. 15 is a diagram showing a memory cell array to which the sense amplifier according to some embodiments of the present inventive concept is applied.
Figure 16:
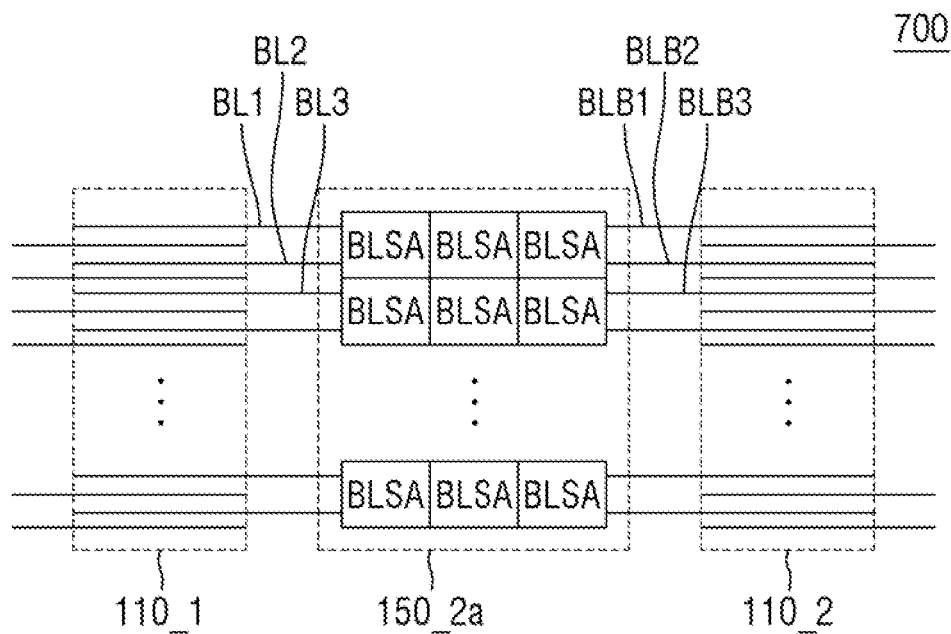
FIG. 16 is a diagram showing a memory cell array to which the sense amplifier according to some embodiments of the present inventive concept is applied.

FIGS. 15 and 16 are diagrams schematically showing a memory device to which the bitline sense amplifier according to some embodiments of the present inventive concept is applied.

FIGS. 15 and 16 are diagrams corresponding to first and second memory cell arrays 110_1 and 110_2 and the bitline sense amplifiers 150_2 which are some of the plurality of memory cell arrays 110_1 to 110_n and the plurality of sense amplifiers 150_1 to 150_n described above in FIG. 3. Each of the bitline sense amplifiers 1502 may include the plurality of bitline sense amplifiers BLSA. The bitline sense amplifiers BLSA may be implemented as the bitline sense amplifiers described in FIGS. 4 to 14.

Unlike the memory device 200 of FIG. 3, in the memory device 600 of FIG. 15, two bitline sense amplifiers BLSA in the second sense amplifier 150_2a are placed to be adjacent to each other. The two bitline sense amplifiers BLSA may be connected to the first and second bitlines BL1 and BL2, and the first and second complementary bitlines BLB1 and BLB2. One of the two bitline sense amplifiers BLSA may detect the voltage change of the first bitline pairs BL1 and BLB1, and the other one may detect the voltage change of the second bitline pairs BL2 and BLB2.

Unlike the memory device 200 of FIG. 3, in the memory device 700 of FIG. 16, three bitline sense amplifiers BLSA in the second sense amplifier 1502b are placed to be adjacent to each other. The three bitline sense amplifiers BLSA may be connected to the first to third bitlines BL1, BL2 and BL3 and the first to third complementary bitlines BLB1, BLB2 and BLB3. Each of the three bitline sense amplifiers BLSA may detect the voltage change of each of the first to third bitline pairs (BL1, BLB1), (BL2, BLB2), and (BL3, BLB3).

The memory devices 600 and 700 of FIGS. 15 and 16 may be selectively applied according to the tendency in which the size of the unit cell decreases due to the miniaturization of the design-rules according to the high integration of memory cell elements. According to the embodiments of the present inventive concept, n bitline sense amplifiers BLSA are placed adjacent to each other, and the n bitline sense amplifiers BLSA are connected to first to $n^{th}$ bitlines BL1 to BLn, and first to $n^{th}$ complementary bitlines BLB1 to BLBn, and each of the n bitline sense amplifiers BLSA may detect the voltage change of each of the first to $n^{th}$ bitline pairs (BL1, BLB1) to (BLn, BLBn).

Figure 17:
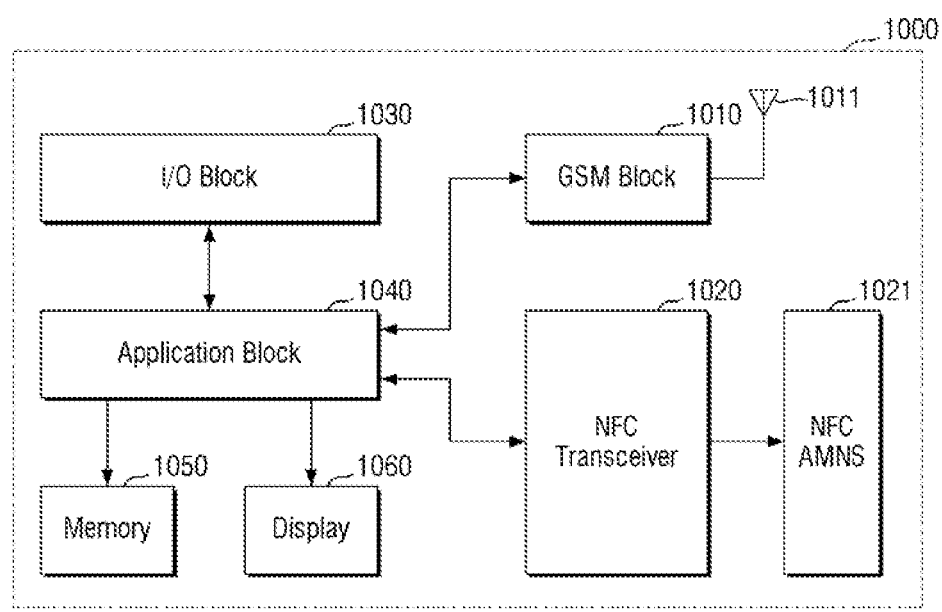
FIG. 17 is a diagram showing an electronic device including a memory device according to some embodiments of the present inventive concept.

FIG. 17 is a block diagram showing an example in which a memory device including the sense amplifier according to the embodiments of the present inventive concept is applied to a mobile device. The mobile device may be a mobile phone or a smart phone.

Referring to FIG. 17, the mobile device 1000 includes a Global System for Mobile communication (GSM) block 1010, an Near Field Communication (NFC) transceiver 1020, an input/output block 1030, an application block 1040, a memory 1050 and a display 1060. In FIG. 17, the components/blocks of the mobile device 1000 are shown as an example. The mobile device 1000 may include more or fewer components/blocks. Further, although this embodiment is shown to use a GSM technology, the mobile device 1000 may be implemented by the use of other technologies such as Code Division Multiple Access (CDMA). The blocks of FIG. 17 will be implemented in the form of an integrated circuit. Alternatively, some of the blocks will be implemented in the form of integrated circuits, while other blocks will be implemented in a separate form.

The GSM block 1010 is connected to an antenna 1011 and may operate to provide the operation of a wireless telephone. The GSM block 1010 may internally include a receiver and a transmitter to perform corresponding receiving and transmitting operations.

The NFC transceiver 1020 may be configured to send and receive NFC signals by utilizing inductive coupling for wireless communication. The NFC transceiver 1020 provides the NFC signals to a NFC antenna matching network system 1021, and the NFC antenna matching network system 1021 may transmit the NFC signals through inductive coupling. The NFC antenna matching network system 1021 may receive NFC signals provided from other NFC devices, and provide the received NFC signals to the NFC transceiver 1020.

The application block 1040 includes hardware circuits, for example, one or more processors, and may operate to provide various user applications provided by the mobile device 1000. The user applications may include voice call operations, data transfer, data swap, and the like. The application block 1040 may operate together with the GSM block 1010 and/or the NFC transceiver 1020 to provide the operating characteristics of the GSM block 1010 and/or the NFC transceiver 1020. Alternatively, the application block 1040 may include a program for a mobile Point Of Sales (POS). Such a program may provide purchase and pay functions for credit cards, using mobile phones, in other words, smartphones.

The display 1060 may display an image in response to a display signal received from the application block 1040. The image may be provided in the application block 1040 or generated by a camera that is built into the mobile device 1000. The display 1060 may internally include a frame buffer for temporary storage of pixel values, and may be configured by a liquid crystal display screen along with associated control circuits.

The input/output block 1030 provides a user with input functionality and provides outputs to be received through the application block 1040.

The memory 1050 stores programs (commands) and/or data to be used by the application block 1040, and may be implemented as a random access memory (RAM), a read only memory (ROM), a flash memory, and the like. Therefore, the memory 1050 may include volatile and non-volatile storage elements. For example, the memory 1050 corresponds to the memory devices 100, 600 and 700 described in FIGS. 1 to 16.

The memory 1050 may include the bitline sense amplifiers described in FIGS. 1 to 9. The bitline sense amplifier includes an amplifier and an equalizer, and the equalizer may include an equalizing enable transistor that has one end connected to one of a first supply line to which a first control signal LA is applied or a second supply line to which a second control signal LAB is applied, and performs an equalizing operation in accordance with the equalizing control signal PEQ.

In concluding the detailed description, those skilled in the art will appreciate that many variations and modifications may be made to the embodiments disclosed herein without substantially departing from the scope of the present inventive concept. Therefore, the disclosed embodiments are not for purposes of limitation.

What is claimed is:

1. A bitline sense amplifier, comprising:
   an amplifier which is connected between a first sensing bitline and a second sensing bitline, and detects and amplifies a voltage difference between a first bitline and a second bitline in response to a first control signal and a second control signal; and
   an equalizer which is connected between a first supply line through which the first control signal is supplied and a second supply line through which the second control signal is supplied, and pre-charges the first bitline and the second bitline with a precharge voltage in response to an equalizing control signal,
   wherein the equalizer includes an equalizing enable transistor in which a source terminal is connected to the first supply line and performs equalizing in response to the equalizing control signal.

2. The bitline sense amplifier of claim 1, wherein the amplifier includes:
   a P-type amplifier including first and second P-type transistors each connected between the first supply line and first and second nodes;
   an N-type amplifier including first and second N-type transistors each connected between the first and second nodes and the second supply line; and
   offset removal circuits including offset transistors which are connected to each of the first and second bitlines and the first and second nodes and operate in response to an offset control signal.

3. The bitline sense amplifier of claim 2, wherein the amplifier includes:
   an isolating circuit which includes a first isolation transistor that is connected between the second bitline and the first node and operates in response to an isolation control signal, and a second isolation transistor that is connected between the first bitline and the second node and operates in response to the isolation control signal.

4. The bitline sense amplifier of claim 1, wherein the equalizing enable transistor is an N-type transistor which is connected between the second supply line and the second bitline and in which the equalizing control signal is applied to a gate thereof.

5. The bitline sense amplifier of claim 4, wherein the bitline sense amplifier includes:
   a fork-shaped N-type active region which includes a first region having spaced portions on a substrate and extending parallel in a first direction, a second region having spaced portions, being parallel with the first region and having a width narrower than the first region, and a third region connected to the spaced portions of the second region;
   a first gate pattern which extends in a second direction on the first region and to which the isolation control signal is applied;
   a second gate pattern which extends in the second direction on the first region and to which the offset control signal is applied; and
   a third gate pattern which extends in the second direction on the first region and to which the equalizing control signal is applied.

6. The bitline sense amplifier of claim 5, further comprising:
   a fourth gate pattern and a fifth gate pattern which extend parallel in the first direction and are placed on a part of the second region and the third region, and to which the second control signal is applied.

7. The bitline sense amplifier of claim 6, further comprising:
   a P-type active region spaced apart from the N-type active region in the first direction; and a sixth gate pattern which is placed on the P-type active region parallel in the first direction and to which the first control signal is applied.

8. The bitline sense amplifier of claim 2, wherein the equalizing enable transistor is a P-type transistor which is connected between the second node and the first supply line and in which the equalizing control signal is applied to a gate thereof.

9. The bitline sense amplifier of claim 8, wherein the bitline sense amplifier includes:
at least two first N-type active regions which have a first spaced portion on a substrate and extend parallel in the first direction;
a first P-type active region which has a first side spaced apart from the first P-type active region in the first direction, and has a first region having a rectangular shape placed in the first direction, a second region having a width narrower than the first region, and a third region having a second spaced portion and connected to the second region;
a first gate pattern which extends in the first direction on the first region and to which the first control signal is applied; and
a second gate pattern which is spaced apart from the first gate pattern in the first direction, extends in the second direction on the third region, and to which the equalizing control signal is applied.

10. The bitline sense amplifier of claim 9, further comprising:
a second N-type active region which has a first side spaced apart from a second side of the first P-type active region in the first direction, and has a rectangular shape placed in the first direction;
at least two third N-type active regions which are placed to be spaced apart from a second side of the second N-type active region in the first direction, have a third spaced portion, and extend parallel in the first direction;
a third gate pattern which is placed on the second N-type active region to extend in the first direction, and to which the second control signal is applied;
a fourth gate pattern which is placed on the at least two third N-type active regions to extend in the second direction, and to which the isolation control signal is applied; and
a fifth gate pattern which is placed on the at least two first N-type active regions to extend in the second direction, and to which the isolation control signal is applied.

11. The bitline sense amplifier of claim 8, wherein the bitline sense amplifier includes:
at least two first N-type active regions which have a first isolation portion on a substrate and extend parallel in the first direction;
a first P-type active region which has a first side spaced apart from the first N-type active region and has a rectangular shape placed in the first direction;
a second N-type active region, a first side of which is spaced apart from a second side of the second N-type active region in the first direction, and which includes a first region of a branch structure, a second region connected to the first region, and a third region having a width wider than the second region and having a rectangular shape placed in the first direction;
a first gate pattern which extends in the second direction on the first region, and to which the equalizing control signal is applied; and second gate patterns which are placed on the third region to extend in the first direction and to which the first control signal is applied.

12. The bitline sense amplifier of claim 11, further comprising:
a third N-type active region which is placed to be spaced apart from a second side of the first P-type active region in the first direction;
a third gate pattern which is placed on the first N-type active region to extend in the second direction and to which the isolation control signal is applied;
fourth gate patterns which are placed on the second N-type active region to extend in the first direction, and to which the second control signal is applied; and
a fifth gate pattern which is placed on the third N-type active region to extend in the second direction, and to which the isolation control signal is applied.

13. The bitline sense amplifier of claim 1, wherein the equalizing enable transistor includes:
a P-type shared active region which includes two rectangular regions and a bridge region that connects the two rectangular regions;
a first gate pattern which is placed on the bridge region in a direction intersecting the bridge region, and to which the equalizing enable control signal is applied;
a first contact which is formed on the first rectangular region of the P-type shared active region and to which the first control signal is applied; and
a second contact which is formed on the second rectangular region of the P-type shared active region and to which the second control signal is applied.

14. The bitline sense amplifier of claim 13, wherein the bridge region of the P-type shared active region has a spaced region, and connects the first rectangular region and the second rectangular region in a diagonally tilted manner.

15. The bitline sense amplifier of claim 13, wherein the bridge region of the P-type shared active region has a spaced region around the first gate pattern, and connects the first rectangular region and the second rectangular region in a bent manner.

16. The bitline sense amplifier of claim 13, comprising:
a first gate pattern pair placed on the first rectangular region; and
a second gate pattern pair placed on the second rectangular region.

17. The bitline sense amplifier of claim 1, wherein the amplifier includes:
a P-type amplifier including first and second P-type transistors each connected between the first supply line and first and second cross-coupling nodes;
an N-type amplifier including first and second N-type transistors each connected between the first and second cross-coupling nodes and the second supply line; and
offset removal circuits including offset transistors which are connected to each of the first and second bitlines and the first and second cross-coupling nodes and operate in response to an offset control signal (P1).

18. The bitline sense amplifier of claim 13, wherein the equalizing enable transistor is a P-type transistor which is connected between a cross-coupling node and the first supply line and in which the equalizing control signal is applied to a gate thereof.

19. The bitline sense amplifier of claim 1, wherein the equalizing enable transistor includes:
a first P-type active region including a first region placed on a substrate with a rectangular shape in the first direction, a second region having a width narrower than the first region, and a third region with a branch structure connected to the second region;
a first control signal contact which is placed on the first region of the first P-type active region and to which the first control signal is applied; and
a first gate pattern which is formed on the third region to extend in the second direction and to which the equalizing enable signal is applied.

20. The bitline sense amplifier of claim 19, wherein the bitline sense amplifier includes:
an N-type active region which is spaced apart from the first P-type active region; and
a second control signal contact which is formed on the N-type active region and to which the first control signal is applied.

* * * * *